(12) United States Patent
Su et al.

(10) Patent No.: US 11,893,919 B2
(45) Date of Patent: Feb. 6, 2024

(54) GATE DRIVING CIRCUIT AND DISPLAY PANEL THAT ALLEVIATE TRAILING OF A FALLING EDGE OF A SIGNAL OUTPUT TERMINAL

(71) Applicants: BEIJING BOE DISPLAY TECHNOLOGY CO., LTD., Beijing (CN); BOE TECHNOLOGY GROUP CO., LTD., Beijing (CN)

(72) Inventors: Qiujie Su, Beijing (CN); Feng Qu, Beijing (CN); Zhihua Sun, Beijing (CN); Seungmin Lee, Beijing (CN); Yanping Liao, Beijing (CN); Hongli Yue, Beijing (CN)

(73) Assignees: BEIJING BOE DISPLAY TECHOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/765,373

(22) PCT Filed: Jun. 10, 2021

(86) PCT No.: PCT/CN2021/099299
§ 371 (c)(1),
(2) Date: Mar. 30, 2022

(87) PCT Pub. No.: WO2022/022096
PCT Pub. Date: Feb. 3, 2022

(65) Prior Publication Data
US 2022/0343821 A1 Oct. 27, 2022

(30) Foreign Application Priority Data
Jul. 31, 2020 (CN) .......................... 202010763129.3

(51) Int. Cl.
*G11C 19/28* (2006.01)
*G09G 3/20* (2006.01)

(52) U.S. Cl.
CPC .............. *G09G 3/20* (2013.01); *G11C 19/28* (2013.01); *G09G 2300/0408* (2013.01);
(Continued)

(58) Field of Classification Search
CPC ............ G09G 3/20; G09G 2300/0408; G09G 2310/0267; G09G 2310/0286; G09G 2310/061; G09G 2330/021; G11C 19/28
See application file for complete search history.

(56) References Cited

U.S. PATENT DOCUMENTS

2010/0277206 A1* 11/2010 Lee ....................... G09G 3/3677 327/108
2020/0160774 A1* 5/2020 Gu ....................... G09G 3/3677

FOREIGN PATENT DOCUMENTS

CN 108962118 A * 12/2018 ............... G09G 3/20
WO WO-2019076124 A1 * 4/2019 ........... G09G 3/3677

* cited by examiner

*Primary Examiner* — Adam J Snyder
(74) *Attorney, Agent, or Firm* — Nath, Goldberg & Meyer; Joshua B. Goldberg

(57) ABSTRACT

A gate driving circuit and a display panel are provided. The gate driving circuit includes M shift registers and N clock signal lines; every N adjacent shift registers among the M shift registers are respectively connected to the N clock signal lines, where N is an even number greater than or equal to 4, and M is an integer greater than or equal to N; a signal output terminal (OUTPUT) of an $i^{th}$ shift register is connected to a signal input terminal (INPUT) of a $(i+p)^{th}$ shift register, where $(N-4)/2 \leq p \leq N/2$, and i is taken from 1 to (M-p); and a pull-up reset signal terminal of a $j^{th}$ shift (Continued)

register is connected to a signal output terminal (OUTPUT) of a $(j+q)^{th}$ shift register, where $1<q-p<N/2$, and j is taken from 1 to (M−q).

8 Claims, 15 Drawing Sheets

(52) U.S. Cl.
CPC ............... *G09G 2310/0267* (2013.01); *G09G 2310/0286* (2013.01); *G09G 2310/061* (2013.01); *G09G 2330/021* (2013.01)

US 11,893,919 B2

GATE DRIVING CIRCUIT AND DISPLAY PANEL THAT ALLEVIATE TRAILING OF A FALLING EDGE OF A SIGNAL OUTPUT TERMINAL

CROSS REFERENCE TO RELATED APPLICATIONS

This is a National Phase Application filed under 35 U.S.C. 371 as a national stage of PCT/CN2021/099299 filed on Jun. 10, 2021, an application claiming priority to Chinese patent application No. 202010763129.3, filed on Jul. 31, 2020, the content of each of which is incorporated herein by reference in its entirety.

TECHNICAL FIELD

The present disclosure belongs to the field of display technology, and particularly relates to a gate driving circuit and a display panel.

BACKGROUND

With continuous development of display technology, displays have gradually developed toward high integration and low cost in recent years. One important technology developed is realization of mass production of Gate Driver on Array (GOA) technology. A Thin Film Transistor (TFT) gate switch circuit is integrated on an array substrate of a display panel through the GOA technology to realize scanning drive of the display panel, so that a gate driving integrated circuit can be omitted, which can reduce product cost from two aspects, namely material cost and manufacturing process, and can also realize a design of two symmetrical sides and narrow bezels (i.e., narrow borders) of the display panel. Meanwhile, a bonding process along a Gate direction can be omitted as well, which facilitates increasing production capacity and yield. The gate switch circuit integrated on the array substrate through the GOA technology is also referred to as a GOA circuit or a shift register circuit.

SUMMARY

Some embodiments of the present disclosure provide a gate driving circuit and a display panel.

In a first aspect, an embodiment of the present disclosure provides a gate driving circuit, including M shift registers and N clock signal lines; every N adjacent shift registers among the M shift registers being respectively connected to the N clock signal lines, where N is an even number greater than or equal to 4, and M is an integer greater than or equal to N;

wherein each of the M shift registers at least includes an input sub-circuit, an output sub-circuit and a pull-up reset sub-circuit; in response to an input signal input by a signal input terminal, the input sub-circuit writes the input signal into a pull-up node; in response to a potential of the pull-up node, the output sub-circuit outputs a clock signal input by a clock signal terminal through a signal output terminal; and in response to a pull-up reset signal input by a pull-up reset signal terminal, the pull-up reset sub-circuit resets the potential of the pull-up node through a turn-off level signal;

a signal output terminal of an $i^{th}$ shift register is connected to a signal input terminal of a $(i+p)^{th}$ shift register, where $(N-4)/2 \leq p \leq N/2$, and i is taken from 1 to (M-p); and a pull-up reset signal terminal of a $j^{th}$ shift register is connected to a signal output terminal of a $(j+q)^{th}$ shift register, where $1 < q - p < N/2$, and j is taken from 1 to (M-q).

Each of the shift registers further includes an output reset sub-circuit; and in response to an output reset signal input by an output reset signal terminal, the output reset sub-circuit resets the signal output terminal through the turn-off level signal.

An output reset signal terminal of a $k^{th}$ shift register is connected to a signal output terminal of a $(k+p)^{th}$ shift register, where k is taken from 1 to (M-p).

$p = (N-4)/2$ in a case where a duty ratio of the clock signal is 30% and $N \geq 6$.

Signal input terminals of a first to a $((N-4)/2)^{th}$ shift registers respond to a frame start signal;

the gate driving circuit further includes 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers; signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-6)/2)^{th}$ to the $M^{th}$ shift registers are respectively connected to signal input terminals of the first to a $((N-4)/2)^{th}$ redundant shift registers; and a signal output terminal of an $h^{th}$ redundant shift register is connected to a signal input terminal of a $(h+(N-4)/2)^{th}$ redundant shift register; where h is taken from 1 to $(2q-(N-4)/2)$.

$p = (N-2)/2$ in a case where a duty ratio of the clock signal is 40% and $N \geq 4$.

Signal input terminals of a first to a $((N-2)/2)^{th}$ shift registers respond to a frame start signal;

the gate driving circuit further includes 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers;

signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-4)/2)^{th}$ to the $M^{th}$ shift registers are respectively connected to signal input terminals of the first to a $((N-2)/2)^{th}$ redundant shift registers; and a signal output terminal of an $h^{th}$ redundant shift register is connected to a signal input terminal of a $(h+(N-2)/2)^{th}$ redundant shift register; where h is taken from 1 to $(2q-(N-2)/2)$.

$p = N/2$ in a case where a duty ratio of the clock signal is 50% and $N \geq 4$.

Signal input terminals of a first to a $N/2^{th}$ shift registers respond to a frame start signal;

the gate driving circuit further includes 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers;

signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-2)/2)^{th}$ to the $M^{th}$ shift registers are respectively connected to signal input terminals of the first to a $N/2^{th}$ redundant shift registers; and a signal output terminal of an $h^{th}$ redundant shift register is connected to a signal input terminal of a $(h+N/2)^{th}$ redundant shift register; where h is taken from 1 to (2q−N/2).

In a second aspect, an embodiment of the present disclosure provides a display panel, including any one of the above gate driving circuits.

DETAIL DESCRIPTION OF EMBODIMENTS

Figure 1:
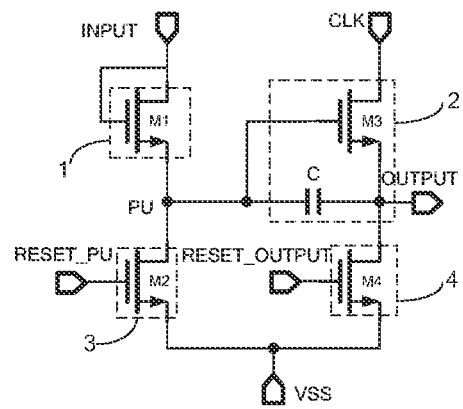
FIG. 1 is a circuit diagram of a shift register.

In order to enable those skilled in the art to better understand the technical solutions of the present disclosure, the present disclosure will be further described in detail below with reference to the accompanying drawings and specific implementations.

Unless otherwise defined, technical terms or scientific terms used herein should have general meanings that can be understood by one of ordinary skill in the technical field to which the present disclosure belongs. The words "first", "second" and the like used herein do not denote any order, quantity, or importance, but are just used to distinguish between different elements from each other. Similarly, the words "an", "a", "the" and the like are not used to limit the quantity, but denote "at least one". The words "include", "comprise" and the like indicate that an element or object before the words cover the elements or objects or the equivalents thereof listed after the words, rather than excluding other elements or objects. The words "connect", "couple" and the like are not restricted to physical or mechanical connection, but may also indicate electrical connection, whether direct or indirect connection. The words "on", "under", "left", "right" and the like are only used to indicate relative positional relationships. When an absolute position of an object described is changed, the relative positional relationships may also be changed accordingly.

It should be noted that transistors used in the embodiments of the present disclosure may be thin film transistors, field effect transistors, or other devices having the same characteristics. Since a source electrode and a drain electrode of each of the transistors used are symmetrical, there is no difference between the source electrode and the drain electrode. In the embodiments of the present disclosure, in order to distinguish between the source electrode and the drain electrode of each transistor, one of the source electrode and the drain electrode is referred to as a first electrode, the other thereof is referred to as a second electrode, and a gate electrode of the transistor is referred to as a control electrode. In addition, the transistors can be classified as N-type transistors and P-type transistors according to their characteristics. The N-type transistors are taken as an example in the following description of the embodiments. In a case where an N-type transistor is used, a first electrode is a source electrode of the N-type transistor, a second electrode is a drain electrode of the N-type transistor, and the source electrode and the drain electrode are electrically connected to each other when a high level is input to a gate electrode of the N-type transistor. The conditions of a P-type transistor are contrary to those of the N-type transistor. It can be readily envisaged by those skilled in the art without creative work to use the P-type transistors instead of the N-type transistors, and therefore, the use of the P-type transistors also falls within the scope of the embodiments of the present disclosure.

Since the transistors used in the embodiments of the present disclosure are the N-type transistors, a turn-on level signal refers to a high level signal and a turn-off level signal refers to a low level signal in the embodiments of the present disclosure; correspondingly, a turn-on level terminal is a high level signal terminal, and a turn-off level terminal is a low level signal terminal.

In general, a display panel includes a plurality of gate lines and a plurality of data lines, and the gate lines and the data lines intersect each other to define a plurality of pixel regions, each of which is provided with a pixel unit. A structure of the display panel will be described by taking a case where an extending direction of each gate line is a row direction and an extending direction of each data line is a column direction as an example. When the display panel is driven to perform display, gate scanning signals can be written to the gate lines row by row and meanwhile data voltage signals can be written to the data lines, respectively, according to an image to be displayed, so that pixel units in the display panel can be lit row by row.

The gate scanning signals are provided by a gate driving circuit, and the data voltage signals are provided by a source driving circuit; in the related art, the gate driving circuit can be integrated in a gate driver chip, and the source driving circuit can be integrated in a source driver chip; in order to reduce the number of chips and realize narrow bezels or no bezels, the GOA technology for integrating a gate driving circuit on an array substrate is provided herein; in the GOA technology, the gate driving circuit includes a plurality of cascaded shift register units integrated on the array substrate, and the shift register units are connected to the gate lines in a one-to-one correspondence way, so that each of the shift register units can provide a gate scanning signal for the gate line connected thereto.

In order to make how the shift register units realize output of the gate scanning signals clearer, a description is given below in conjunction with specific examples of the shift register units.

In an example, as shown in a circuit diagram of a shift register unit in FIG. 1, the shift register unit includes an input sub-circuit 1, an output sub-circuit 2, a pull-up reset sub-circuit 3 and an output reset sub-circuit 4; in response to an input signal input by a signal input terminal INPUT, the input sub-circuit 1 charges a pull-up node PU through the input signal; in response to a potential of the pull-up node PU, the output sub-circuit 2 outputs a clock signal input by a clock signal terminal CLK through a signal output terminal OUTPUT; in response to a pull-up reset signal output by a pull-up reset signal terminal RESET_PU, the pull-up reset sub-circuit 3 resets the pull-up node PU through a low level signal; and in response to an output reset signal, the output reset sub-circuit 4 resets the signal output terminal OUTPUT through a low level signal.

Specifically, as shown in FIG. 1, the output sub-circuit 1 includes a first transistor M1; the pull-up reset sub-circuit 3 includes a second transistor M2; the output sub-circuit 2 includes a third transistor M3 and a storage capacitor C; the output reset sub-circuit 4 includes a fourth transistor M4; a gate electrode and a source electrode of the first transistor M1 are connected to the signal input terminal INPUT, and a drain electrode of the first transistor M1 is connected to the pull-up node PU; a gate electrode of the second transistor M2 is connected to the pull-up reset signal terminal RESET_PU, a source electrode of the second transistor M2 is connected to the pull-up node PU, and a drain electrode of the second transistor M2 is connected to a low level signal terminal VSS; a gate electrode of the third transistor M3 is connected to the pull-up node PU, a source electrode of the third transistor M3 is connected to the clock signal terminal CLK, and a drain electrode of the third transistor M3 is connected to the signal output terminal OUTPUT; a first terminal of the storage capacitor C is connected to the pull-up node PU, and a second terminal of the storage capacitor C is connected to the signal output terminal OUTPUT; and a gate electrode of the fourth transistor M4 is connected to an output reset signal terminal RESET_OUTPUT, a source electrode of the fourth transistor M4 is connected to the signal output terminal OUTPUT, and a drain electrode of the fourth transistor M4 is connected to the low level signal terminal VSS.

In an input stage, a high level signal is written to the signal input terminal INPUT, the first transistor M1 is turned on, the pull-up node PU is pulled up through the high level signal, and the storage capacitor C is charged.

In an output stage, since the pull-up node PU is pulled up in the input stage, the third transistor M3 is turned on, and a high level signal input by the clock signal terminal CLK is output to the gate line connected to the shift register unit through the signal output terminal OUTPUT.

In a reset stage, a high level signal is input to the output reset signal terminal RESET_OUTPUT, the fourth transistor M4 is turned on, and an output of the signal output terminal OUTPUT is pulled down through a low level signal input by the low level signal terminal VSS; and a high level signal is input to the pull-up reset signal terminal RESET_PU, the second transistor M2 is turned on, the potential of the pull-up node PU is pulled down through a low level signal input by the low level signal terminal VSS. Thus, resetting of the pull-up node PU and resetting of the signal output terminal OUTPUT are completed.

It should be noted that the output reset sub-circuit may be omitted from the shift register unit. In such a case, after the pull-up node PU is reset in the reset stage, the pull-up node PU is at a low level, at this time, the third transistor M3 is turned off, and the signal output terminal OUTPUT stops outputting, so that the resetting of the signal output terminal OUTPUT is completed.

Figure 2:
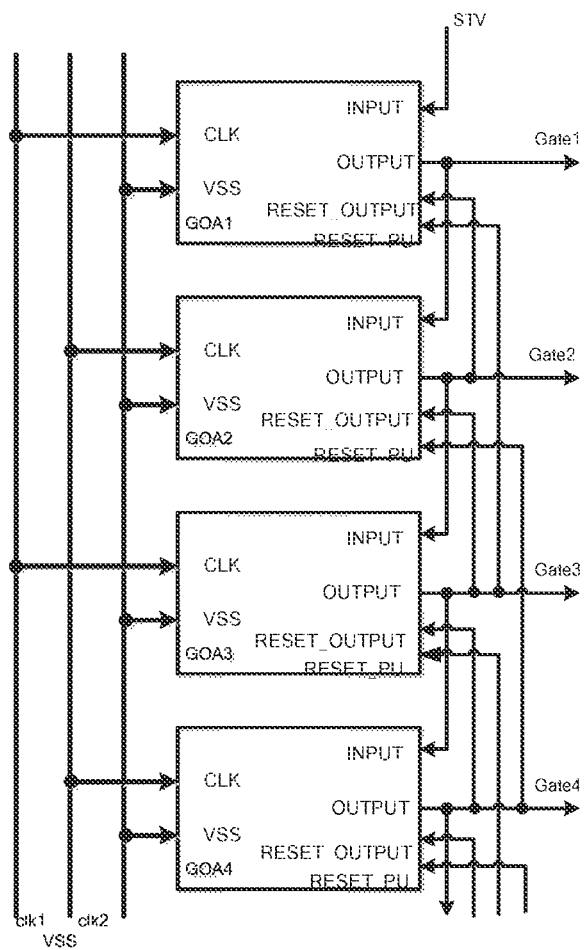
FIG. 2 is a schematic diagram of a cascade of a gate driving circuit.

In addition, for the gate driving circuit adopting the above shift register unit, as shown in FIG. 2, a signal output terminal OUTPUT of a shift register unit in a current stage is connected to a pull-up reset signal terminal RESET_PU of a shift register unit in a previous stage, and a signal input terminal INPUT of a shift register unit in a next stage.

Figure 3:
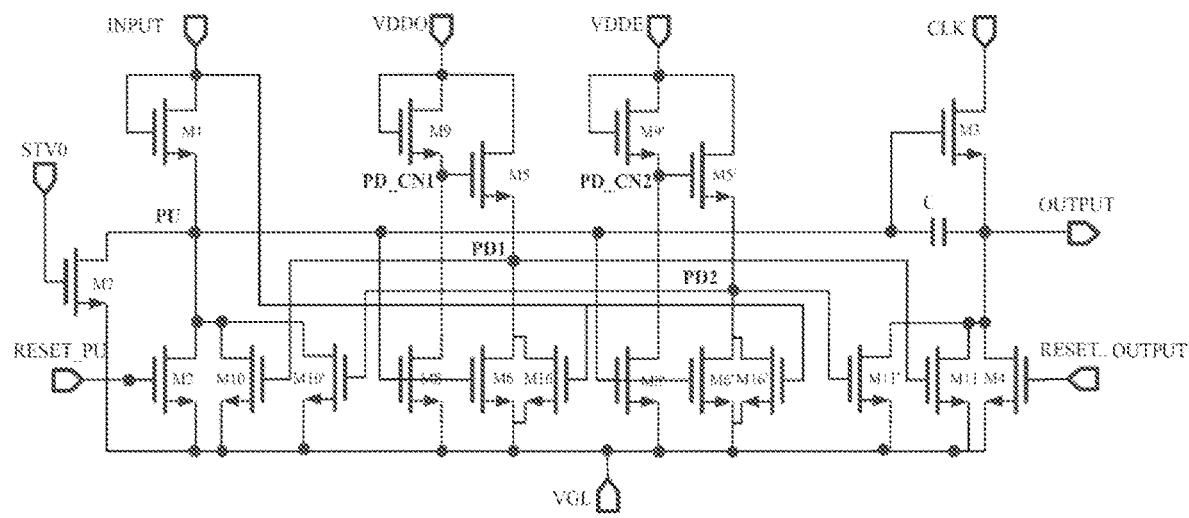
FIG. 3 is a circuit diagram of another shift register.

In another example, as shown in FIG. 3, in order to optimize the shift register unit, another shift register unit is further provided, which not only includes the input sub-circuit, the output sub-circuit and the pull-up reset sub-circuit described above, but also includes a first pull-down control sub-circuit, a second pull-down control sub-circuit, a first pull-down sub-circuit, a second pull-down sub-circuit, a first noise reduction sub-circuit, a second noise reduction sub-circuit, a discharge sub-circuit, a first auxiliary sub-circuit, and a second auxiliary sub-circuit. In response to a pre-frame start signal (which may also be referred to as a frame start signal) input by a pre-frame start signal terminal STV0, the discharge sub-circuit discharges the pull-up node PU through a low level signal input by the low level signal terminal VGL; the first pull-down control sub-circuit and the second pull-down control sub-circuit have the same structure and the same function, and just operate in a time-division manner; similarly, the first pull-down sub-circuit and the second pull-down sub-circuit have the same structure and the same function; the first auxiliary sub-circuit and the second auxiliary sub-circuit have the same structure and the same function; and the first noise reduction sub-circuit and the second noise reduction sub-circuit have the same structure and the same function. The structures and functions of the input sub-circuit, the output sub-circuit and the pull-up reset sub-circuit are the same as those described above, and thus are not repeated here. In response to input signals input by the signal input terminal INPUT, the first auxiliary sub-circuit and the second auxiliary sub-circuit pull down a first pull-down node PD1 and a second pull-down node PD2 respectively through low level signals; in response to a first power supply voltage input by a first power supply voltage signal terminal, the first pull-down control sub-circuit controls a potential of the first pull-down node PD1; in response to a second power supply voltage input by a second power supply voltage signal terminal, the second pull-down control sub-circuit controls a potential of the second pull-down node PD2; in response to the pull-up node PU, the first pull-down sub-circuit pulls down the first pull-down node PD1 and a first pull-down control node PD_CN1 through a level signal input by the low level signal terminal VGL; in response to the pull-up node PU, the second pull-down sub-circuit pulls down the second pull-down node PD2 and a second pull-down control node PD_CN2 through a level signal input by the low level signal terminal VGL; and in response to the potential of the first pull-down node PD1, the first noise reduction sub-circuit performs noise reduction on signals output from the pull-up node PU and the signal output terminal OUTPUT through a level signal input by the low level signal terminal VGL. In response to the potential of the pull-up node PU, a cascaded sub-circuit outputs the clock signal input by the clock signal terminal CLK through a cascaded signal output terminal OUT_C, as shown in FIG. 4.

It should be noted that a signal output by the cascaded signal output terminal OUT_C and that output by the signal output terminal OUTPUT are the same, and the only difference between the two output terminals provided in the shift register unit is that the signal output terminal OUTPUT is connected to a gate line and the cascaded signal output terminal OUT_C is configured for cascading. The cascaded sub-circuit is separately provided to reduce a load of the signal output terminal OUTPUT, so as to avoid affecting the gate scanning signals output by the signal output terminal OUTPUT.

Figure 4:
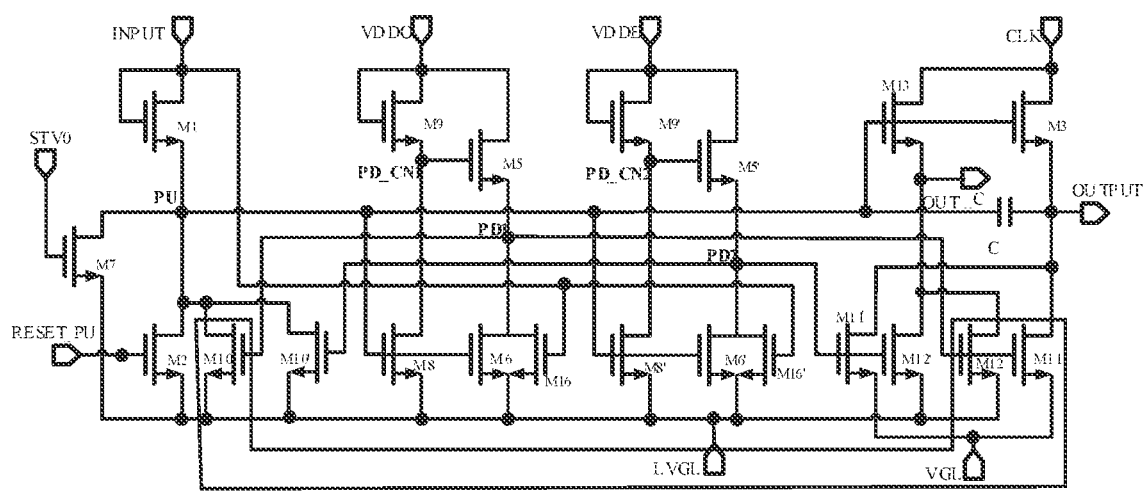
FIG. 4 is a circuit diagram of yet another shift register.

In addition, for a gate driving circuit adopting the above shift register unit, as shown in FIG. 3 and FIG. 4, a cascaded signal output terminal OUT_C of a shift register unit in a current stage is connected to a pull-up reset signal terminal RESET_PU of a shift register unit in a previous stage and a signal input terminal INPUT of a shift register unit in a next stage. Alternatively, it should be understood that each shift register unit above may not be provided with the cascaded sub-circuit, in which case a signal output terminal OUTPUT of the shift register unit in the current stage is connected to the pull-up reset signal terminal RESET_PU of the shift register in the previous stage and the signal input terminal INPUT of the shift register unit in the next stage.

Specifically, as shown in FIG. 3 and FIG. 4, each of the first pull-down control sub-circuit and the second pull-down control sub-circuit includes a fifth transistor and a ninth transistor; and the fifth transistors in the first pull-down control sub-circuit and the second control sub-circuit are denoted by M5 and M5', respectively, and the ninth transistors in the first pull-down control sub-circuit and the second control sub-circuit are denoted by M9 and M9', respectively. Each of the first pull-down sub-circuit and the second pull-down sub-circuit includes a sixth transistor and an eighth transistor; and the sixth transistors in the first pull-down sub-circuit and the second pull-down sub-circuit are denoted by M6 and M6', respectively, and the eighth transistors in the first, pull-down sub-circuit and the second pull-down sub-circuit are denoted by M8 and M8' respectively. Each of the first noise reduction sub-circuit and the second noise reduction sub-circuit includes a tenth transistor, an eleventh transistor, and a twelfth transistor; and the tenth transistors in the first noise reduction sub-circuit and the second noise reduction sub-circuit are denoted by M10 and M10', respectively, and the eleventh transistors in the first noise reduction sub-circuit and the second noise reduction sub-circuit are denoted by M11 and M11', respectively; and the discharge sub-circuit includes a seventh transistor M7. Each of the first auxiliary sub-circuit and the second auxiliary sub-circuit includes a sixteenth transistor, and the sixteenth transistors in the first auxiliary sub-circuit and the second auxiliary sub-circuit are denoted by M16 and M16', respectively.

Still with reference to FIG. 3, the gate electrode and the source electrode of the first transistor M1 are connected to the signal input terminal INPUT, and the drain electrode of the first transistor M1 is connected to the pull-up node PU; the gate electrode of the second transistor M2 is connected to the pull-up reset signal terminal RESET_PU, the source electrode of the second transistor M2 is connected to the pull-up node PU, and the drain electrode of the second transistor M2 is connected to the low level signal terminal VGL; the gate electrode of the third transistor M3 is connected to the pull-up node PU, the source electrode of the third transistor M3 is connected to the clock signal terminal CLK, and the drain electrode of the third transistor M3 is connected to the signal output terminal OUTPUT; the first terminal of the storage capacitor C is connected to the pull-up node PU, and the second terminal of the storage capacitor C is connected to the signal output terminal OUTPUT; a gate electrode and a source electrode of the ninth transistor M9 are both connected to the first power supply voltage terminal VDDO, and a drain electrode of the ninth transistor M9 is connected to the first pull-down control node PD_CN1; a gate electrode of the fifth transistor M5 is connected to the first pull-down control node PD_CN1, a source electrode of the fifth transistor M5 is connected to the first power supply voltage terminal VDDO, and a drain electrode of the fifth transistor M5 is connected to the first pull-down node PD1; a gate electrode and a source electrode of the ninth transistor M9' are both connected to the second power supply voltage terminal VDDE, and a drain electrode of the ninth transistor M9' is connected to the second pull-down control node PD_CN2; a gate electrode of the fifth transistor M5' is connected to the second pull-down control node PD_CN2, a source electrode of the fifth transistor M5' is connected to the second power supply voltage terminal VDDE, and a drain electrode of the fifth transistor M5' is connected to the second pull-down node PD2; a gate electrode of the sixth transistor M6 is connected to the pull-up node PU, a source electrode of the sixth transistor M6 is connected to the first pull-down node PD1, and a drain electrode of the sixth transistor M6 is connected to the low level signal terminal VGL; a gate electrode of the eighth transistor M8 is connected to the pull-up node PU, a source electrode of the eighth transistor M8 is connected to the first pull-down control node PD_CN1, and a drain electrode of the eighth transistor M8 is connected to the low level signal terminal VGL; a gate electrode of the sixth transistor M6' is connected to the pull-up node PU, a source electrode of the sixth transistor M6' is connected to the second pull-down node PD2, and a drain electrode of the sixth transistor M6' is connected to the low level signal terminal VGL; a gate electrode of the eighth transistor M8' is connected to the pull-up node PU, a source electrode of the eighth transistor M8' is connected to the second pull-down control node PD_CN2, and a drain electrode of the eighth transistor M8' is connected to the low level signal terminal VGL; a gate electrode of the tenth transistor M10 is connected to the first pull-down node PD1, a source electrode of the tenth transistor M10 is connected to the pull-up node PU, and a drain electrode of the tenth transistor M10 is connected to the low level signal terminal VGL; a gate electrode of the eleventh transistor M11 is connected to the first pull-down node PD1, a source electrode of the eleventh transistor M11 is connected to the signal output terminal OUTPUT, and a drain electrode of the eleventh transistor M11 is connected to the low level signal terminal VGL; a gate electrode of the tenth transistor M10' is connected to the second pull-down node PD2, a source electrode of the tenth transistor M10' is connected to the pull-up node PU, and a drain electrode of the tenth transistor M10' is connected to the low level signal terminal VGL; a gate electrode of the eleventh transistor M11' is connected to the second pull-down node PD2, a source electrode of the eleventh transistor M11' is connected to the signal output terminal OUTPUT, and a drain electrode of the eleventh transistor M11' is connected to the low level signal terminal VGL; a gate electrode of the seventh transistor M7 is connected to the pre-frame start signal terminal, a source electrode of the seventh transistor M7 is connected to the pull-up node PU, and a drain electrode of the seventh transistor M7 is connected to the low level signal terminal VGL; and a gate electrode of the thirteenth transistor M13 is connected to the pull-up node PU, a source electrode of the thirteenth transistor M13 is connected to the clock signal terminal CLK, and a drain electrode of the thirteenth transistor M13 is connected to a cascaded signal output terminal (as shown in FIG. 4). A gate electrode of the sixteenth transistor M16 is connected to the signal input terminal INPUT, a source electrode of the sixteenth transistor M16 is connected to the first pull-down node PD1, and a drain electrode of the sixteenth transistor M16 is connected to the low level signal terminal VGL. A gate electrode of the sixteenth transistor M16' is connected to the signal input terminal INPUT, a source electrode of the sixteenth transistor M16' is connected to the second pull-down node PD2, and a drain electrode of the sixteenth transistor M16' is connected to the low level signal terminal VGL.

The first pull-down control sub-circuit formed by the fifth transistor M5 and the ninth transistor M9, and the second pull-down control sub-circuit formed by the fifth transistor M5' and the ninth transistor M9' operate in a time-division manner (that is, operate in turn or operate alternately); correspondingly, since the first noise reduction sub-circuit formed by the tenth transistor M10 and the eleventh transistor M11 and the second noise reduction sub-circuit formed by the tenth transistor M10' and the eleventh transistor M11' are controlled by the first pull-down control sub-circuit and the second pull-down control sub-circuit, respectively, the first noise reduction sub-circuit and the second noise reduction sub-circuit also operate in a time-division manner. An operating principle of the first pull-down control sub-circuit is the same as that of the second pull-down control sub-circuit, and an operating principle of the first noise reduction sub-circuit is the same as that of the second noise reduction sub-circuit; therefore, an operating principle of the shift register unit while the first pull-down control sub-circuit and the first noise reduction sub-circuit are operating will be described below.

In a discharging stage, before a frame, that is, before display is performed, a high level signal is firstly input to the pre-frame start signal terminal, and the pull-up node PU is discharged through a low level signal input by the low level signal terminal VGL, so that abnormal display caused by residual charges at the pull-up node PU is prevented.

In the input stage, a high level signal is input to the signal input terminal INPUT, the first transistor M1 is turned on, the pull-up node PU is pulled up through the high level signal, and the storage capacitor C is charged.

In the output stage, since the pull-up node PU is pulled up in the input stage, the third transistor M3 is turned on, and a high level signal input by the clock signal terminal CLK is output to the gate line connected to the shift register unit through the signal output terminal OUTPUT.

In the reset stage, a high level signal is input to the pull-up reset signal terminal RESET_PU, the second transistor M2 is turned on, a potential of the pull-up node PU is pulled down through a low level signal input by the low level signal terminal VGL, thereby resetting the pull-up node PU; and since the pull-up node PU is pulled down, the third transistor M3 is turned off, and both the signal output terminal OUTPUT and the cascaded signal output terminal OUT_C stop outputting high level signals. Meanwhile, the first pull-down control node PD_CN1 and first pull-down node PD1 are both provided with high level signals, and the tenth transistor M10 and the eleventh transistor M11 are turned on, so that outputs from the pull-up node PU, the signal output terminal OUTPUT and the cascaded signal output terminal OUT_C are respectively subjected to noise reduction until the potential of the pull-up node PU is pulled up when scanning of a next frame is started.

As shown in FIG. 4, in order to reduce the load of the signal output terminal OUTPUT, the signal output by the signal output terminal OUTPUT is only configured to control turn-on and turn-off of the gate line, and the cascaded sub-circuit is further provided in the shift register unit; and the cascaded sub-circuit outputs the clock signal input by the clock signal terminal CLK through the cascaded signal output terminal OUT_C in response to the potential of the pull-up node PU. The signal output by the cascaded signal output terminal OUT_C is the same as that output by the signal output terminal OUTPUT, that is, the cascaded signal output terminal OUT_C outputs a high level signal to the pull-up reset signal terminal RESET_PU of the shift register unit in the previous stage and the signal output terminal OUTPUT outputs a high level signal to the signal input terminal INPUT of the shift register unit in the next stage. The cascaded sub-circuit includes a thirteenth transistor M13, a gate electrode of the thirteenth transistor M13 is connected to the pull-up node PU, a source electrode of the thirteenth transistor M13 is connected to the clock signal terminal CLK, and a drain electrode of the thirteenth transistor M13 is connected to the cascaded signal output terminal OUT_C. Meanwhile, each of the first noise reduction sub-circuit and the second noise reduction sub-circuit is further provided with a twelfth transistor, and the twelfth transistors in the first noise reduction sub-circuit and the second noise reduction sub-circuit are denoted by M12 and M12', respectively, and are configured to perform noise reduction on the signal output by the cascaded signal output terminal OUT_C. A gate electrode of the twelfth transistor M12 is connected to the first pull-down node PD1, a source electrode of the twelfth transistor M12 is connected to the cascaded signal output terminal OUT_C, and a drain electrode of the twelfth transistor M12 is connected to the low level signal terminal; and a gate electrode of the twelfth transistor M12' is connected to the second pull-down node PD2, a source electrode of the twelfth transistor M12' is connected to the cascaded signal output terminal OUT_C, and a drain electrode of the twelfth transistor M12' is connected to the low level signal terminal.

It should be noted that the signal output by the signal output terminal OUTPUT and that output by the cascaded signal output terminal OUT_C are synchronous, and the cascaded sub-circuit may be omitted in practical applications. In this case, the shift register unit in the current stage is cascaded with the shift register unit in the previous stage and the shift register unit in the next stage through the signal output terminal OUTPUT. A case where the shift register unit in the current stage is cascaded with the shift register unit in the previous stage and the shift register unit in the next stage through the cascaded signal output terminal OUT_C is merely taken as an example in the following description, but the present disclosure is not limited thereto.

Figure 5:
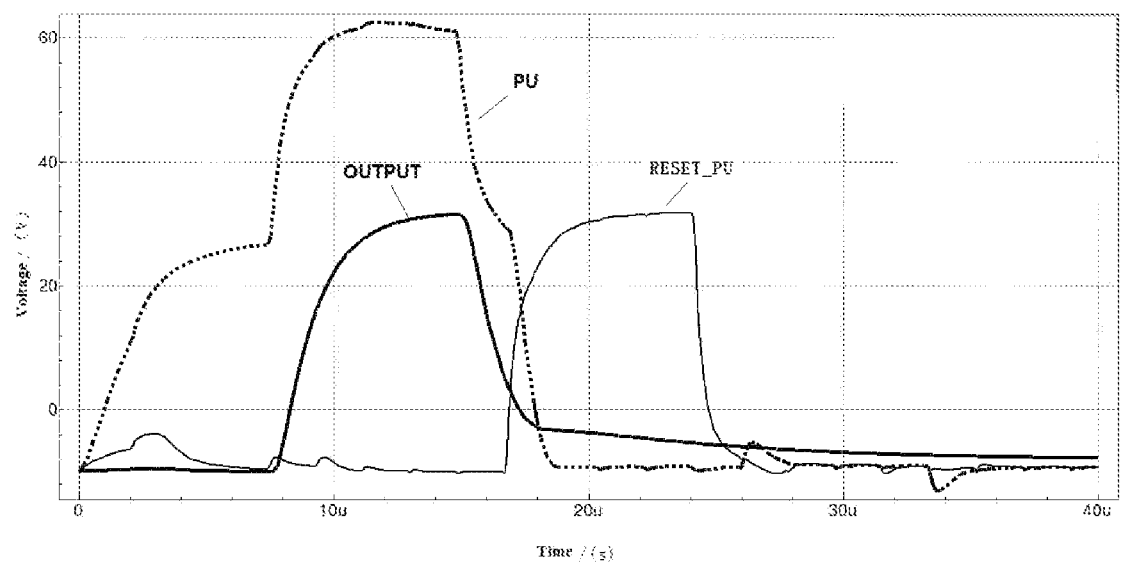
FIG. 5 is a waveform diagram of signals from a pull-up node, a signal output terminal, and a pull-up reset output terminal of a shift register having the cascaded structure (or cascaded arrangement) shown in FIG. 2.

The applicants have found that since one shift register in the gate driving circuit provides gate scanning signals for a row of gate line (i.e., a gate line in a row), the number of the shift registers in the gate driving circuit increases with an increase of product resolution, and meanwhile, the number of clock signal lines also increases, for example, 8, 10, 12 or more clock signal lines are needed. In a very common gate driving circuit provided with 10 clock signal lines, a duty ratio of a clock signal is 40%, that is, the clock signal is at high level for 4H of one period and at low level for 6H of the one period. Assuming that the gate driving circuit includes M shift registers, where M is an integer greater than or equal to 10, a cascade relationship of the M shift registers in the prior art is that a signal output terminal OUTPUT of an $i^{th}$ shift register is connected to a signal input terminal INPUT of a $(i+4)^{th}$ shift register, where i is taken from 1 to (M−4); a pull-up reset signal terminal RESET_PU of a $j^{th}$ shift register is connected to a signal output terminal OUTPUT of a $(j+5)^{th}$ shift register, where j is taken from 1 to (M−5); and an output reset signal terminal RESET_OUTPUT of a $k^{th}$ shift register is connected to a signal output terminal OUTPUT of a $(k+4)^{th}$ shift register, where k is taken from 1 to (M−4). It can be seen that a pull-up node PU is reset with a delay of 1H with respect to a signal output terminal OUTPUT. For a 8K/120 Hz display panel, 1H is 1.85 us, in an existing cascade structure, after a clock signal is at low level (e.g., the signal output terminal OUTPUT is reset), the pull-up node PU is also pulled down to be reset after the pull-up node PU is kept at a high level for merely 1.85 us, and the third transistor M3 has only 1.85 us to discharge to the signal output terminal OUTPUT, which results in serious trailing (or tailing) of a falling edge of the signal output terminal OUTPUT, as shown in FIG. 5.

In view of the above problem, the following technical solutions are provided in the embodiments of the present disclosure.

In a first aspect, an embodiment of the present disclosure provides a gate driving circuit, which includes M shift registers and N clock signal lines; every N adjacent shift registers among the M shift registers are respectively connected to the N clock signal lines, where N is an even number greater than or equal to 4, and M is an integer greater than or equal to N; each of the M shift registers at least includes an input sub-circuit, an output sub-circuit and a pull-up reset sub-circuit; in response to an input signal input by a signal input terminal INPUT, the input sub-circuit writes the input signal into a pull-up node PU; in response to a potential of the pull-up node PU, the output sub-circuit outputs a clock signal input by a clock signal terminal CLK through a signal output terminal OUTPUT; and in response to a pull-up reset signal input by a pull-up reset signal terminal RESET_PU, the pull-up reset sub-circuit resets the potential of the pull-up node PU through a low level signal. In the embodiment of the present disclosure, a signal output terminal OUTPUT of an $i^{th}$ shift register is connected to a signal input terminal INPUT of a $(i+p)^{th}$ shift register, where (N−4)/2≤p≤N/2, and i is taken from 1 to (M−p); and a pull-up reset signal terminal RESET_PU of a $j^{th}$ shift register is connected to a signal output terminal OUTPUT of a $(j+q)^{th}$ shift register, where 1<q−p<N/2, and j is taken from 1 to (M−q).

Figure 6:
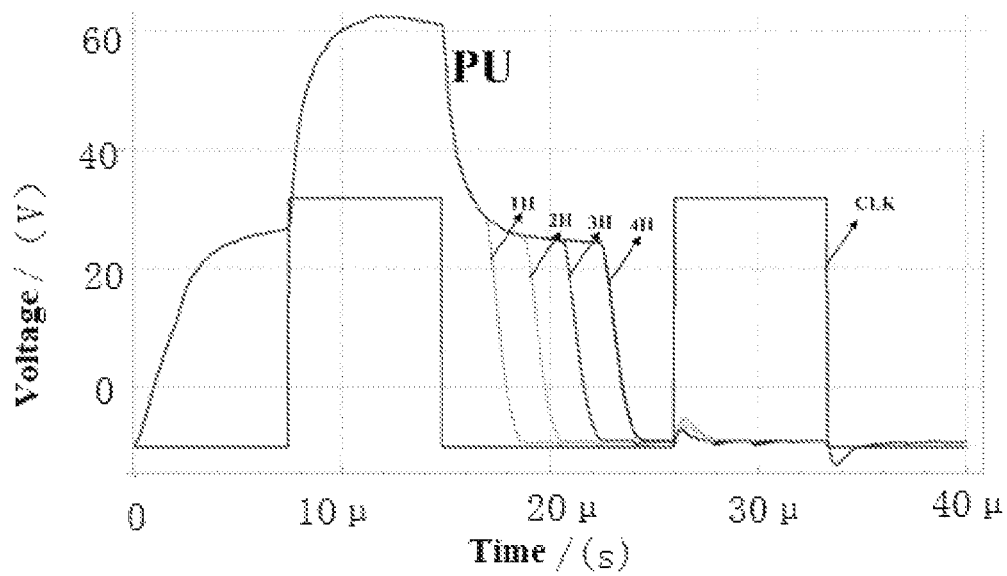
FIG. 6 is a waveform diagram of signals from a pull-up node, a signal output terminal, and a pull-up reset output terminal when a pull-up node of a shift register is reset with a delay of 2H to 4H and a delay of 1H according to an embodiment of the present disclosure.

Assuming that i=j=1, p=2 and q=4, a signal output terminal OUTPUT of a first shift register is connected to a signal input terminal INPUT of a third shift register; and a pull-up reset signal terminal RESET_PU of the first shift register is connected to a signal output terminal OUTPUT of a fifth shift register, it can be seen that a high level signal is written into the pull-up reset signal terminal RESET_PU of the first shift register with a delay of 2H, that is, a pull-up node PU is pulled down with a delay of 2H, so that an output sub-circuit of the first shift register may operate for a delay of 2H, and the output sub-circuit may discharge the signal output terminal OUTPUT through a low level signal written through a clock signal line, thereby alleviating trailing of a falling edge of the signal output terminal OUTPUT, as shown in FIG. 6.

It should be noted that it is satisfied in the embodiment of the present disclosure that p−q>1, and in such a case, a pull-up node PU of each shift register is pulled down at least with a delay of 2H, and of course, q and p also need to satisfy q−p<N/2, so that it may be avoided that the pull-up node PU is still not reset before being written with a high level signal in a next frame.

In some embodiments, each of the shift registers not only includes the above structures but also includes an output reset sub-circuit; and in response to an output reset signal input by an output reset signal terminal RESET_OUTPUT, the output reset sub-circuit resets the signal output terminal OUTPUT through a low level signal. An output reset signal terminal RESET_OUTPUT of a $k^{th}$ shift register is connected to a signal output terminal OUTPUT of a $(k+p)^{th}$ shift register, where k is taken from 1 to (M−p).

Since the output reset signal terminal RESET_OUTPUT of the $k^{th}$ shift register is connected to the signal output terminal OUTPUT of the $(k+p)^{th}$ shift register and the signal output terminal OUTPUT of the $(k+q)^{th}$ shift register, respectively, and q and p satisfies 1<q−p<N/2, that is, a pull-up node PU of the $k^{th}$ shift register is reset at least with a delay of 2H with respect to a signal output terminal OUTPUT thereof, so that an output sub-circuit of the $k^{th}$ shift register may operate for a delay of 2H, and the output sub-circuit may discharge a signal output terminal OUTPUT through a low level signal written through a clock signal line, thereby alleviating trailing of a falling edge of the signal output terminal OUTPUT.

In order to make a structure of the gate driving circuit provided by the embodiments of the present disclosure clearer, a cascade relationship of the shift registers in the gate driving circuit is described below by taking examples where the number N of the clock signal lines varies and the duty ratio of the clock signal varies, that is, the duty ratio of the clock signal is 30%, 40%, or 50%.

In an example where the number N of the clock signal lines is an even number greater than or equal to 6 and the duty ratio of the clock signal is 30%, it is satisfied that p=(N−4)/2 and N/2-1<q<N−2; signal input terminals INPUT of a first to a (N−4)/2th shift registers respond to a pre-frame start signal; a signal output terminal OUTPUT of an $i^{th}$ shift register is connected to a signal input terminal INPUT of a $(i+(N-4)/2)^{th}$ shift register; and a pull-up reset signal terminal RESET_PU of a $j^{th}$ shift register is connected to a signal output terminal OUTPUT of a $(j+q)^{th}$ shift register; where i is taken from 1 to $(M-(N-4)/2)$, and j is taken from 1 to $(M-q)$.

In addition, since a signal output terminal OUTPUT of an $M^{th}$ shift register (a shift register in a last stage) is connected to a pull-up reset signal output terminal OUTPUT of a $(M-q)^{th}$ shift register, there is no shift register to provide reset signals for pull-up nodes PU of the shift registers from the $(M-q+1)^{th}$ shift register. Accordingly, a pull-up reset signal terminal RESET_PU of the $M^{th}$ shift register needs a signal output terminal OUTPUT of a $(M+q)^{th}$ shift register to provide a pull-up reset signal, and at the same time, it should be ensured that the $(M+q)^{th}$ shift register may operate normally, so that 2q shift registers need to be added to the original structure of the gate driving circuit. Therefore, in some embodiments, the gate driving circuit further includes 2q redundant shift registers, and every N adjacent redundant shift registers among the 2q redundant shift registers are respectively connected to the N clock signal lines; signal output terminals OUTPUT of a first to a $q^{th}$ redundant shift registers are respectively connected to pull-up reset signal terminals RESET_PU of the $(M-q+1)^{th}$ to the $M^{th}$ shift registers; and signal output terminals OUTPUT of a $(q+1)^{th}$ to a $(2q)^{th}$ redundant shift registers are respectively connected to pull-up reset signal terminals RESET_PU of the first to the $q^{th}$ redundant shift registers. Signal output terminals OUTPUT of a $(M-(N-6)/2)^{th}$ to the $M^{th}$ shift registers are respectively connected to signal input terminals INPUT of the first to a $((N-4)/2)^{th}$ redundant shift registers; and a signal output terminal OUTPUT of an $h^{th}$ redundant shift register is connected to a signal input terminal INPUT of a $(h+(N-4)/2)$th redundant shift register; where h is taken from 1 to $(2q-(N-4)/2)$.

Figure 7:
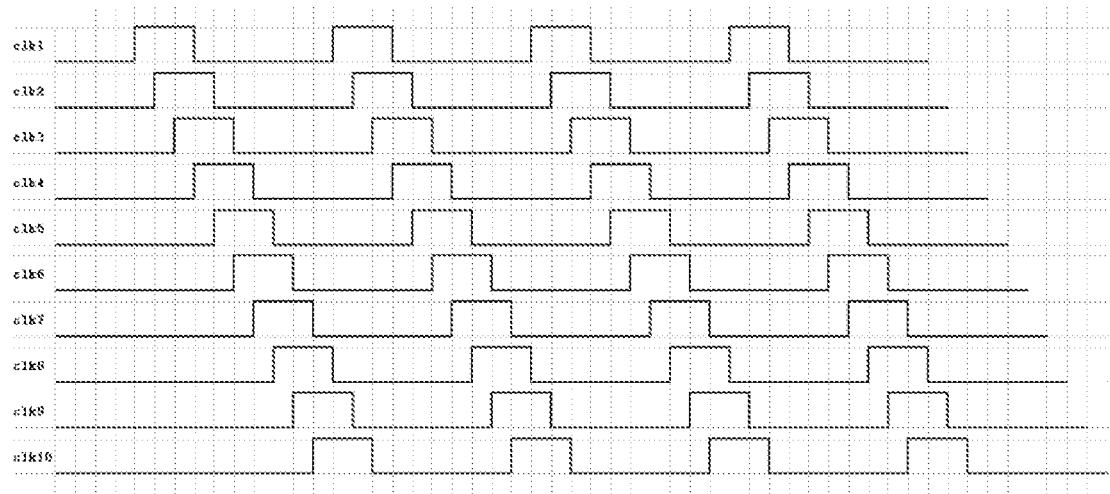
FIG. 7 is a timing diagram of a gate driving circuit in a case where the number of clock signal lines is 10 and a duty ratio of a clock signal is 30%.
Figure 8:
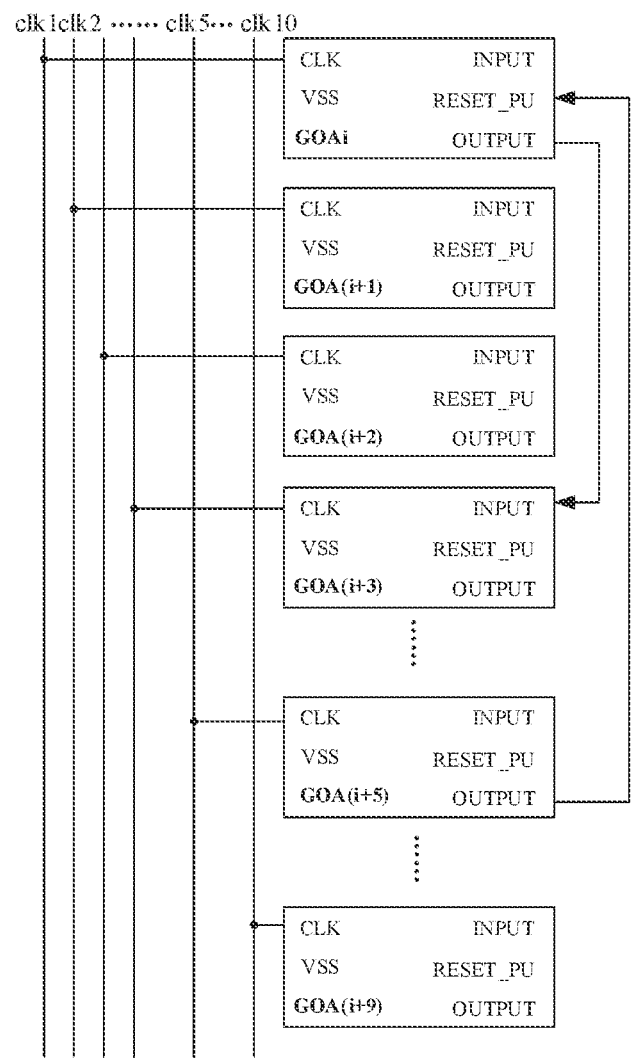
FIG. 8 is a schematic diagram of a cascade of a gate driving circuit when a pull-up node is reset with a delay of 2H in the case where the number of the clock signal lines is 10 and the duty ratio of the clock signal is 30%.

A description is given below by taking a case where the number N of the clock signal lines is 10 and the duty ratio of the clock signal is 30% as an example. In such a case, p=3; 4<q<8, that is, a value of q may be 5, 6 or 7; as shown in FIG. 7 and FIG. 8, the shift registers in such a case under the condition that q=5 are first described; signal input terminals INPUT of a first to a third shift registers respond to a frame start signal; a signal output terminal OUTPUT of an $i^{th}$ shift register is connected to a signal input terminal INPUT of a $(i+3)^{th}$ shift register; and a pull-up reset signal terminal RESET_PU of a $j^{th}$ shift register is connected to a signal output terminal OUTPUT of a $(j+5)^{th}$ shift register; where i is taken from 1 to $(M-3)$, and j is taken from 1 to $(M-5)$. At this time, it can be seen that, in the gate driving circuit so cascaded, a pull-up node PU of each shift register is reset with a delay of 2H, so that an output sub-circuit of each shift register may operate for a delay of 2H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 10 redundant shift registers, which are respectively connected to 10 clock signal lines; signal output terminals OUTPUT of a first to a fifth redundant shift registers are respectively connected to pull-up reset signal terminals RESET_PU of a $(M-4)^{th}$ to an $M^{th}$ shift registers; and signal output terminals OUTPUT of a sixth to a tenth redundant shift registers are respectively connected to pull-up reset signal terminals RESET_PU of the first to the fifth redundant shift registers. Signal output terminals OUTPUT of a $(M-2)^{th}$ to the $M^{th}$ shift registers are respectively connected to signal input terminals INPUT of the first to the third redundant shift registers; and a signal output terminal OUTPUT of an $h^{th}$ redundant shift register is connected to a signal input terminal INPUT of a $(h+3)^{th}$ redundant shift register; where h is taken from 1 to 7.

Figure 9:
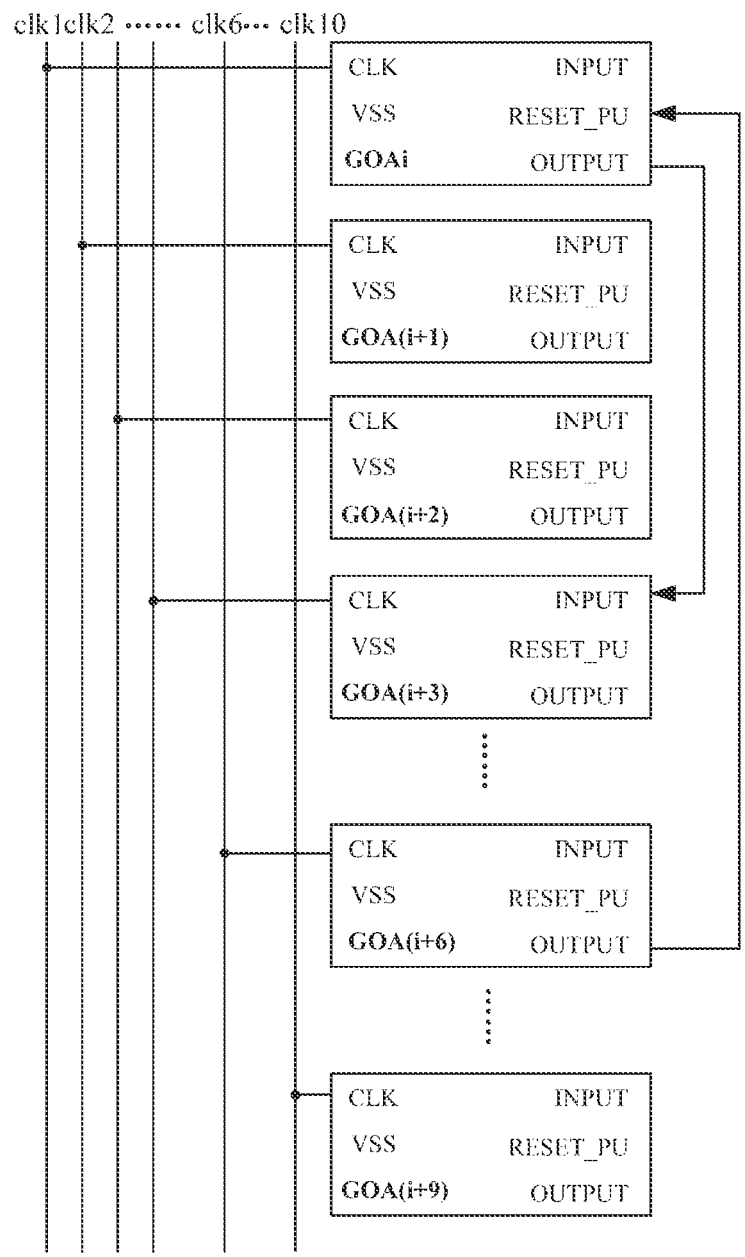
FIG. 9 is a schematic diagram of a cascade of a gate driving circuit when a pull-up node is reset with a delay of 3H in the case where the number of the clock signal lines is 10 and the duty ratio of the clock signal is 30%.

Similarly, as shown in FIG. 9, the shift registers in such a case under the condition that q=6 are then described: the signal input terminals INPUT of the first to the third shift registers respond to the frame start signal; the signal output terminal OUTPUT of the $i^{th}$ shift register is connected to the signal input terminal INPUT of the $(i+_3)^{th}$ shift register; and the pull-up reset signal terminal RESET_PU of the $j^{th}$ shift register is connected to a signal output terminal OUTPUT of a $(j+6)^{th}$ shift register; where i is taken from 1 to $(M-3)$, and j is taken from 1 to $(M-6)$. At this time, it can be seen that, in the gate driving circuit so cascaded, a pull-up node PU of each shift register is reset with a delay of 3H, so that an output sub-circuit of each shift register may operate for a delay of 3H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 12 redundant shift registers, a first to a tenth redundant shift registers among the 12 redundant shift registers are respectively connected to the 10 clock signal lines, and an eleventh redundant shift register and a twelfth redundant shift register are respectively connected to a first clock signal line and a second clock signal line; signal output terminals OUTPUT of a first to a sixth redundant shift registers are respectively connected to pull-up reset signal terminals RESET_PU of a $(M-5)^{th}$ to the $M^{th}$ shift registers; and signal output terminals OUTPUT of a seventh to a twelfth redundant shift registers are respectively connected to pull-up reset signal terminals RESET_PU of the first to the sixth redundant shift registers. Signal output terminals OUTPUT of the $(M-2)^{th}$ to the $M^{th}$ shift registers are respectively connected to signal input terminals INPUT of the first to the third redundant shift registers; and the signal output terminal OUTPUT of the $h^{th}$ redundant shift register is connected to the signal input terminal INPUT of the $(h+3)^{th}$ redundant shift register; where h is taken from 1 to 9.

Figure 10:
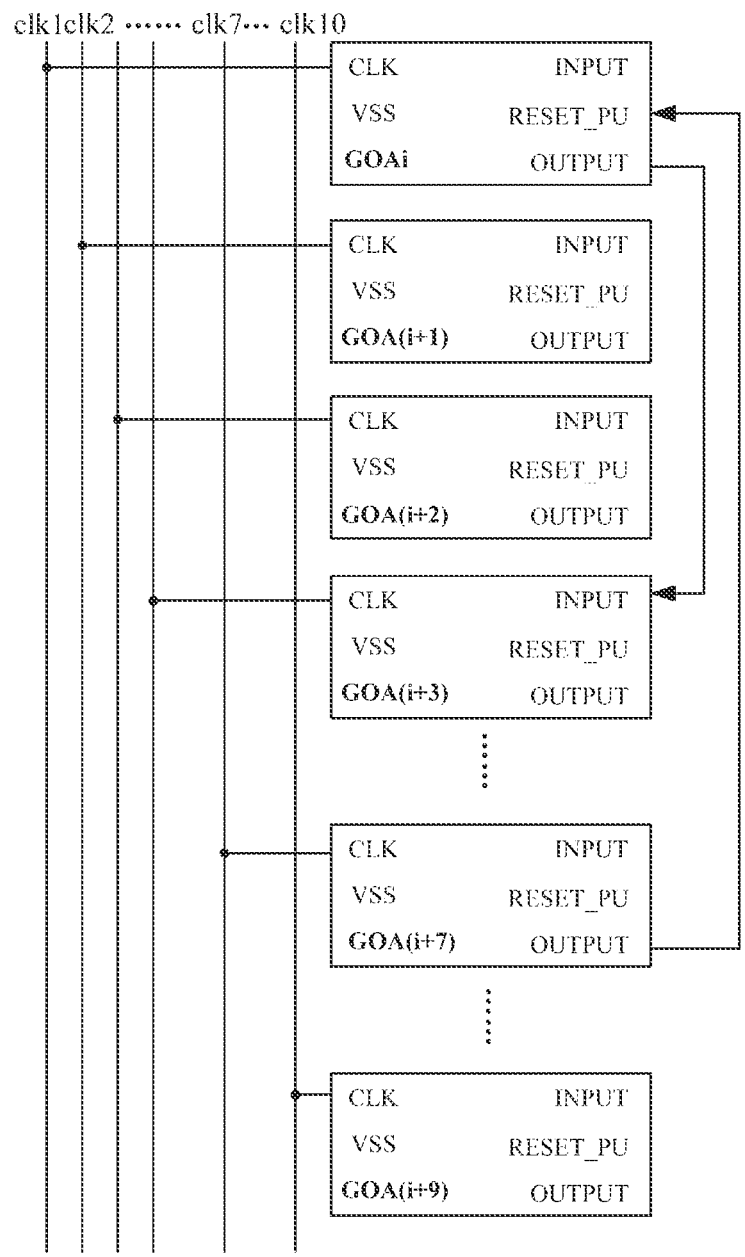
FIG. 10 is a schematic diagram of a cascade of a gate driving circuit when a pull-up node is reset with a delay of 4H in the case where the number of the clock signal lines is 10 and the duty ratio of the clock signal is 30%.

As shown in FIG. 10, the shift registers in such a case under the condition that q=7 are then described: the signal input terminals INPUT of the first to the third shift registers respond to the frame start signal; the signal output terminal OUTPUT of the $i^{th}$ shift register is connected to the signal input terminal INPUT of the $(i+_3)^{th}$ shift register; and the pull-up reset signal terminal RESET_PU of the $j^{th}$ shift register is connected to a signal output terminal OUTPUT of a $(j+7)^{th}$ shift register; where i is taken from 1 to $(M-3)$, and j is taken from 1 to $(M-7)$. At this time, it can be seen that, in the gate driving circuit so cascaded, a pull-up node PU of each shift register is reset with a delay of 4H, so that an output sub-circuit of each shift register may operate for a delay of 4H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 14 redundant shift registers, a first to a tenth redundant shift registers among the 14 redundant shift registers are respectively connected to the 10 clock signal lines, and an eleventh to a fourteenth redundant shift registers are respectively connected to a first to a fourth clock signal lines; signal output terminals OUTPUT of a first to a seventh redundant shift registers are respectively connected to pull-up reset signal terminals RESET_PU of a $(M-6)^{th}$ to the $M^{th}$ shift registers; and signal output terminals OUTPUT of an eighth to a fourteenth redundant shift registers are respectively connected to pull-up reset signal terminals RESET_PU of the first to the seventh redundant shift registers. Signal output terminals OUTPUT of the $(M-2)^{th}$ to the $M^{th}$ shift registers are respectively connected to signal input terminals INPUT of the first to the third redundant shift registers; and the signal output terminal OUTPUT of the $h^{th}$ redundant shift register is connected to the signal input terminal INPUT of the $(h+3)^{th}$ redundant shift register; where h is taken from 1 to 11.

In another example where the number N of the clock signal lines is an even number greater than or equal to 4 and the duty ratio of the clock signal is 40%, it is satisfied that $p=(N-2)/2$ and $N/2<q<N-1$; signal input terminals INPUT of a first to a $(N-2)/2^{th}$ shift registers respond to a frame start signal; a signal output terminal OUTPUT of an $i^{th}$ shift register is connected to a signal input terminal INPUT of a $(i+(N-2)/2)^{th}$ shift register; and a pull-up reset signal terminal RESET_PU of a $j^{th}$ shift register is connected to a signal output terminal OUTPUT of a $(j+q)^{th}$ shift register; where i is taken from 1 to (M-(N-2)/2), and j is taken from 1 to (M-q).

In addition, since a signal output terminal OUTPUT of an $M^{th}$ shift register (a shift register in a last stage) is connected to a pull-up reset signal output terminal OUTPUT of a $(M-q)^{th}$ shift register, there is no shift register to provide reset signals for pull-up nodes PU of the shift registers from the $(M-q+1)^{th}$ shift register. Accordingly, a pull-up reset signal terminal RESET_PU of the $M^{th}$ shift register needs a signal output terminal OUTPUT of a $(M+q)^{th}$ shift register to provide a pull-up reset signal, and at the same time, it should be ensured that the $(M+q)^{th}$ shift register may operate normally, so that 2q shift registers need to be added to the original structure of the gate driving circuit. Therefore, in some embodiments, the gate driving circuit further includes 2q redundant shift registers, and every N adjacent redundant shift registers among the 2q redundant shift registers are respectively connected to the N clock signal lines; signal output terminals OUTPUT of a first to a $q^{th}$ redundant shift registers are respectively connected to pull-up reset signal terminals RESET_PU of the $(M-q+1)^{th}$ to the $M^{th}$ shift registers; and signal output terminals OUTPUT of a $(q+1)^{th}$ to a $(2q)^{th}$ redundant shift registers are respectively connected to pull-up reset signal terminals RESET_PU of the first to the $q^{th}$ redundant shift registers. Signal output terminals OUTPUT of a $(M-(N-4)/2)^{th}$ to the $M^{th}$ shift registers are respectively connected to signal input terminals INPUT of the first to an $((N-2)/2)^{th}$ redundant shift registers; and a signal output terminal OUTPUT of an $h^{th}$ redundant shift register is connected to a signal input terminal INPUT of a (h+(N-2)/2)th redundant shift register; where h is taken from 1 to (2q-(N-2)/2).

Figure 11:
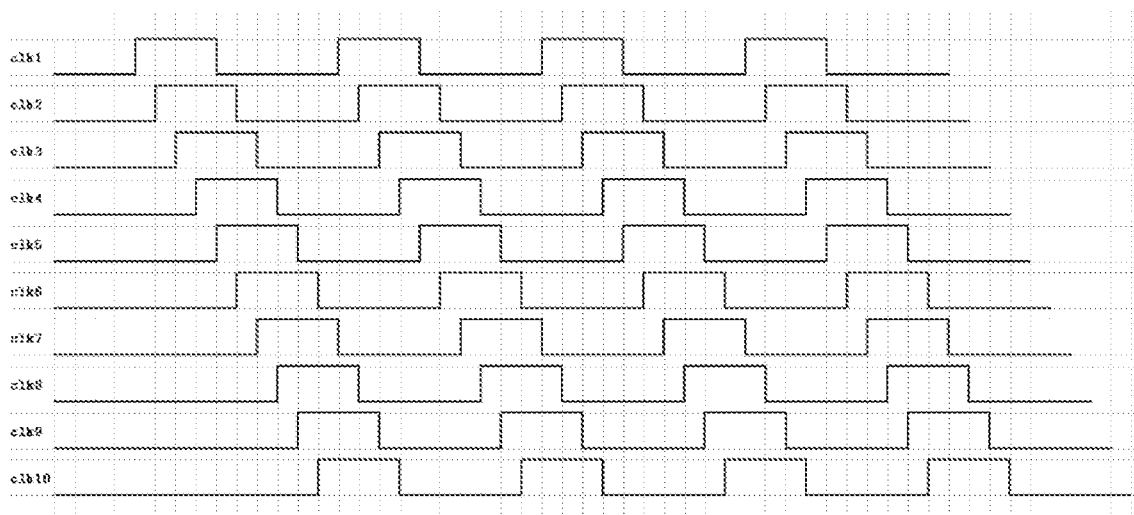
FIG. 11 is a timing diagram of a gate driving circuit in a case where the number of the clock signal lines is 10 and the duty ratio of the clock signal is 40%.
Figure 12:
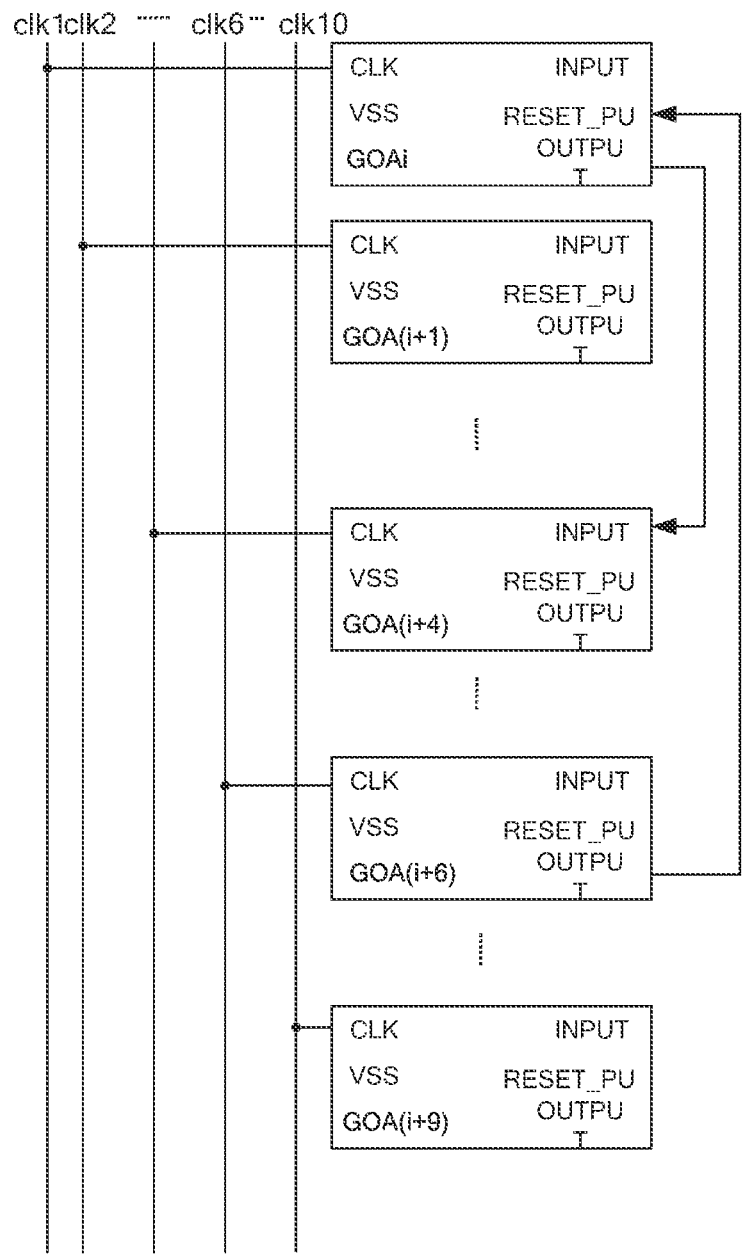
FIG. 12 is a schematic diagram of a cascade of a gate driving circuit when a pull-up node is reset with a delay of 2H in the case where the number of the clock signal lines is 10 and the duty ratio of the clock signal is 40%.

A description is given below by taking a case where the number N of the clock signal lines is 10 and the duty ratio of the clock signal is 40% as an example. In such a case, $p=4$; $5<q<9$, that is, a value of q may be 6, 7 or 8; as shown in FIG. 11 and FIG. 12, the shift registers in such a case under the condition that $q=6$ are first described; signal input terminals INPUT of a first to a fourth shift registers respond to a frame start signal; a signal output terminal OUTPUT of an $i^{th}$ shift register is connected to a signal input terminal INPUT of a $(i+4)^{th}$ shift register; and a pull-up reset signal terminal RESET_PU of a $j^{th}$ shift register is connected to a signal output terminal OUTPUT of a $(j+6)^{th}$ shift register; where i is taken from 1 to (M-4), and j is taken from 1 to (M-6). At this time, it can be seen that, in the gate driving circuit so cascaded, a pull-up node PU of each shift register is reset with a delay of 2H, so that an output sub-circuit of each shift register may operate for a delay of 2H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 12 redundant shift registers, a first to a tenth redundant shift registers among the 12 redundant shift registers are respectively connected to the 10 clock signal lines, and an eleventh redundant shift register and a twelfth redundant shift register are respectively connected to a first clock signal line and a second clock signal line; signal output terminals OUTPUT of a first to a sixth redundant shift registers are respectively connected to pull-up reset signal terminals RESET_PU of a $(M-5)^{th}$ to the $M^{th}$ shift registers; and signal output terminals OUTPUT of a seventh to a twelfth redundant shift registers are respectively connected to pull-up reset signal terminals RESET_PU of the first to the sixth redundant shift registers. Signal output terminals OUTPUT of a (M-3)th to the $M^{th}$ shift registers are respectively connected to signal input terminals INPUT of the first to a fourth redundant shift registers; and the signal output terminal OUTPUT of the $h^{th}$ redundant shift register is connected to a signal input terminal INPUT of a $(h+4)^{th}$ redundant shift register; where h is taken from 1 to 8.

Figure 13:
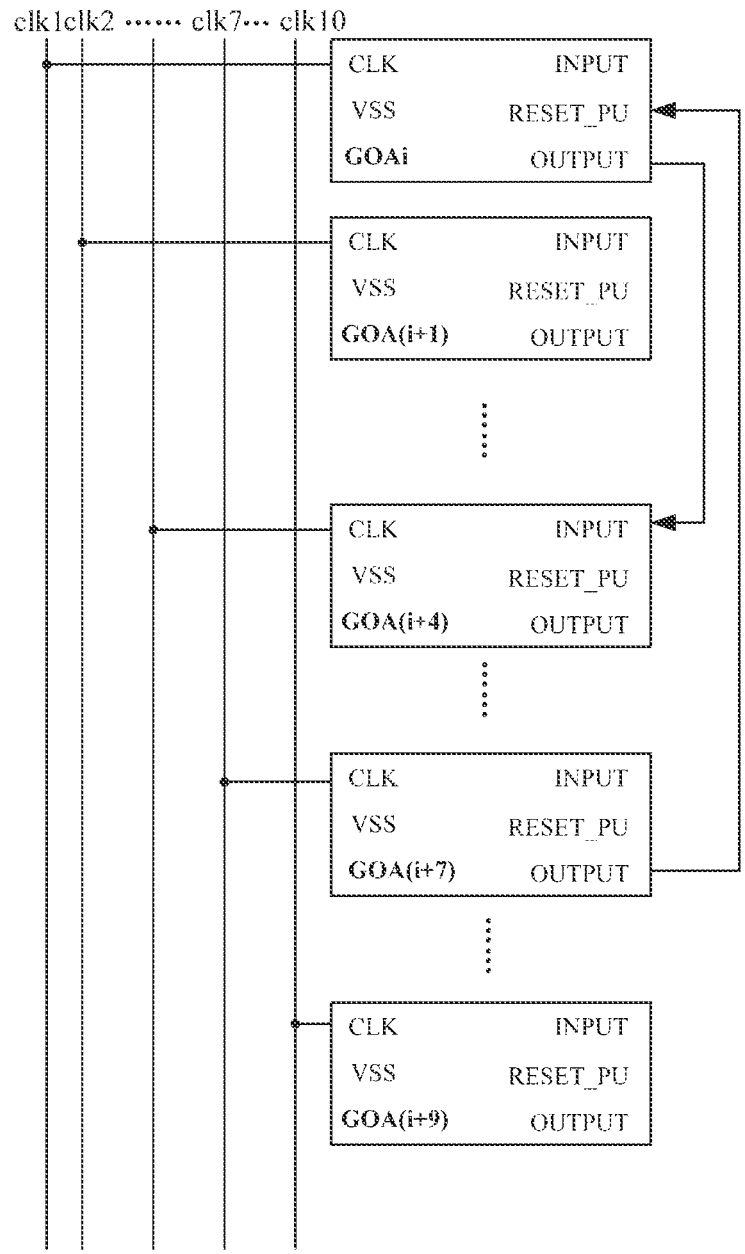
FIG. 13 is a schematic diagram of a cascade of a gate driving circuit when a pull-up node is reset with a delay of 3H in the case where the number of the clock signal lines is 10 and the duty ratio of the clock signal is 40%.

Similarly, as shown in FIG. 13, the shift registers in such a case under the condition that $q=7$ are then described: the signal input terminals INPUT of the first to the fourth shift registers respond to the frame start signal; the signal output terminal OUTPUT of the $i^{th}$ shift register is connected to the signal input terminal INPUT of the $(i+4)^{th}$ shift register; and the pull-up reset signal terminal RESET_PU of the $j^{th}$ shift register is connected to a signal output terminal OUTPUT of a $(j+7)^{th}$ shift register; where i is taken from 1 to (M-4), and j is taken from 1 to (M-7). At this time, it can be seen that, in the gate driving circuit so cascaded, a pull-up node PU of each shift register is reset with a delay of 3H, so that an output sub-circuit of each shift register may operate a delay of 3H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 14 redundant shift registers, a first to a tenth redundant shift registers among the 14 redundant shift registers are respectively connected to the 10 clock signal lines, and an eleventh to a fourteenth redundant shift registers are respectively connected to a first to a fourth clock signal lines; signal output terminals OUTPUT of a first to a seventh redundant shift registers are respectively connected to pull-up reset signal terminals RESET_PU of a $(M-6)^{th}$ to the $M^{th}$ shift registers; and signal output terminals OUTPUT of an eighth to a fourteenth redundant shift registers are respectively connected to pull-up reset signal terminals RESET_PU of the first to the seventh redundant shift registers. Signal output terminals OUTPUT of a $(M-3)^{th}$ to the $M^{th}$ shift registers are respectively connected to signal input terminals INPUT of the first to the fourth redundant shift registers; and the signal output terminal OUTPUT of the $h^{th}$ redundant shift register is connected to the signal input terminal INPUT of the $(h+4)^{th}$ redundant shift register; where h is taken from 1 to 10.

Figure 14:
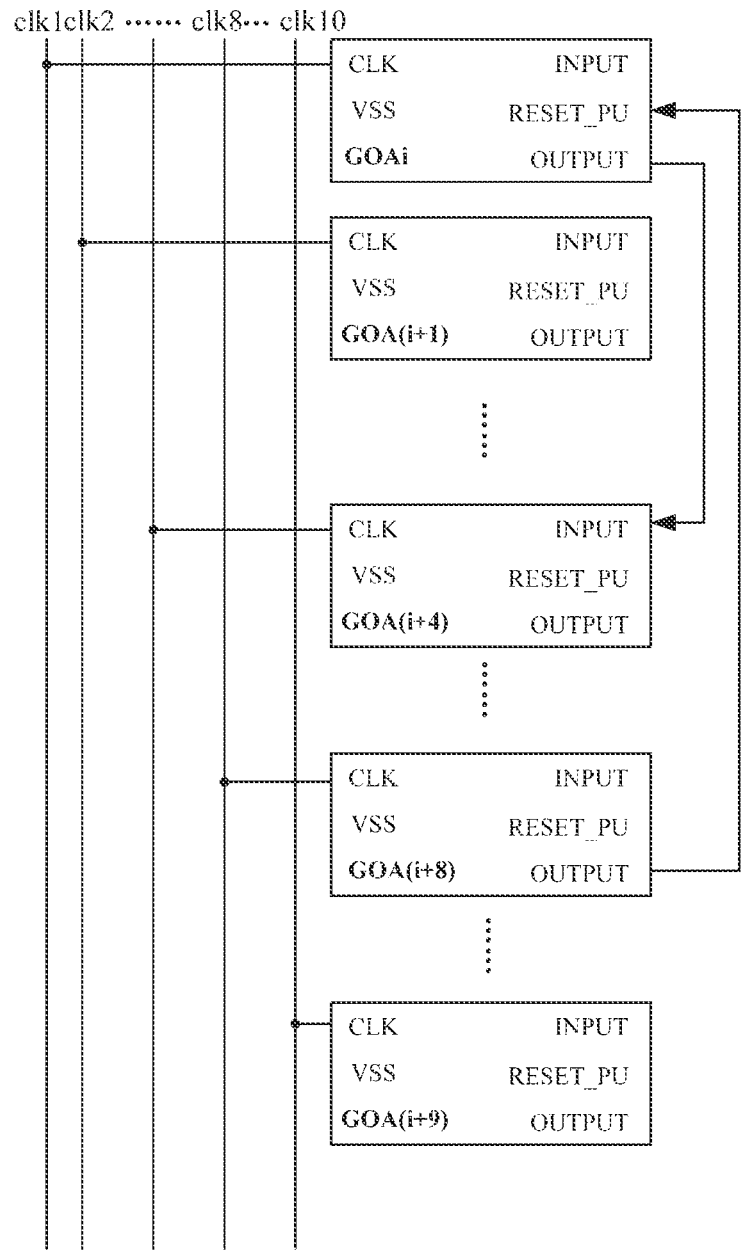
FIG. 14 is a schematic diagram of a cascade of a gate driving circuit when a pull-up node is reset with a delay of 4H in the case where the number of the clock signal lines is 10 and the duty ratio of the clock signal is 40%.

As shown in FIG. 14, the shift registers in such a case under the condition that q=8 are then described: the signal input terminals INPUT of the first to the fourth shift registers respond to the frame start signal; the signal output terminal OUTPUT of the $i^{th}$ shift register is connected to the signal input terminal INPUT of the $(i+_4)^{th}$ shift register; and the pull-up reset signal terminal RESET_PU of the $j^{th}$ shift register is connected to a signal output terminal OUTPUT of a $(j+8)^{th}$ shift register; where i is taken from 1 to (M−4), and j is taken from 1 to (M−8). At this time, it can be seen that, in the gate driving circuit so cascaded, a pull-up node PU of each shift register is reset with a delay of 4H, so that an output sub-circuit of each shift register may operate for a delay of 4H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 16 redundant shift registers, a first to a tenth redundant shift registers among the 16 redundant shift registers are respectively connected to the 10 clock signal lines, and an eleventh to a sixteenth redundant shift registers are respectively connected to a first to a sixth clock signal lines; signal output terminals OUTPUT of a first to an eighth redundant shift registers are respectively connected to pull-up reset signal terminals RESET_PU of a $(M-7)^{th}$ to the $M^{th}$ shift registers; and signal output terminals OUTPUT of a ninth to a sixteenth redundant shift registers are respectively connected to pull-up reset signal terminals RESET_PU of the first to the eighth redundant shift registers. The signal output terminals OUTPUT of the $(M-3)^{th}$ to the $M^{th}$ shift registers are respectively connected to signal input terminals INPUT of the first to the fourth redundant shift registers; and the signal output terminal OUTPUT of the $h^{th}$ redundant shift register is connected to the signal input terminal INPUT of the $(h+4)^{th}$ redundant shift register; where h is taken from 1 to 12.

In another example where the number N of the clock signal lines is an even number greater than or equal to 4 and the duty ratio of the clock signal is 50%, it is satisfied that p=N/2 and N/2+1<q<N; signal input terminals INPUT of a first to a N/2th shift registers respond to a pre-frame start signal; a signal output terminal OUTPUT of an $i^{th}$ shift register is connected to a signal input terminal INPUT of a $(i+N/2)^{th}$ shift register; and a pull-up reset signal terminal RESET_PU of a $j^{th}$ shift register is connected to a signal output terminal OUTPUT of a $(j+q)^{th}$ shift register; where i is taken from 1 to (M-N/2), and j is taken from 1 to (M−q).

In addition, since a signal output terminal OUTPUT of an $M^{th}$ shift register (a shift register in a last stage) is connected to a pull-up reset signal output terminal OUTPUT of a $(M-q)^{th}$ shift register, there is no shift register to provide reset signals for pull-up nodes PU of the shift registers from the $(M-q+1)^{th}$ shift register. Accordingly, a pull-up reset signal terminal RESET_PU of the $M^{th}$ shift register needs a signal output terminal OUTPUT of a $(M+q)^{th}$ shift register to provide a pull-up reset signal, and at the same time, it should be ensured that the $(M+q)^{th}$ shift register may operate normally, so that 2q shift registers need to be added to the original structure of the gate driving circuit. Therefore, in some embodiments, the gate driving circuit further includes 2q redundant shift registers, and every N adjacent redundant shift registers among the 2q redundant shift registers are respectively connected to the N clock signal lines; signal output terminals OUTPUT of a first to a $q^{th}$ redundant shift registers are respectively connected to pull-up reset signal terminals RESET_PU of the $(M-q+1)^{th}$ to the $M^{th}$ shift registers; and signal output terminals OUTPUT of a $(q+1)^{th}$ to a $(2q)^{th}$ redundant shift registers are respectively connected to pull-up reset signal terminals RESET_PU of the first to the $q^{th}$ redundant shift registers. Signal output terminals OUTPUT of a $(M-(N-2)/2)^{th}$ to the $M^{th}$ shift registers are respectively connected to signal input terminals INPUT of the first to a $N/2^{th}$ redundant shift registers; and a signal output terminal OUTPUT of an $h^{th}$ redundant shift register is connected to a signal input terminal INPUT of a $(h+N/2)^{th}$ redundant shift register; where h is taken from 1 to (2q−N/2).

Figure 15:
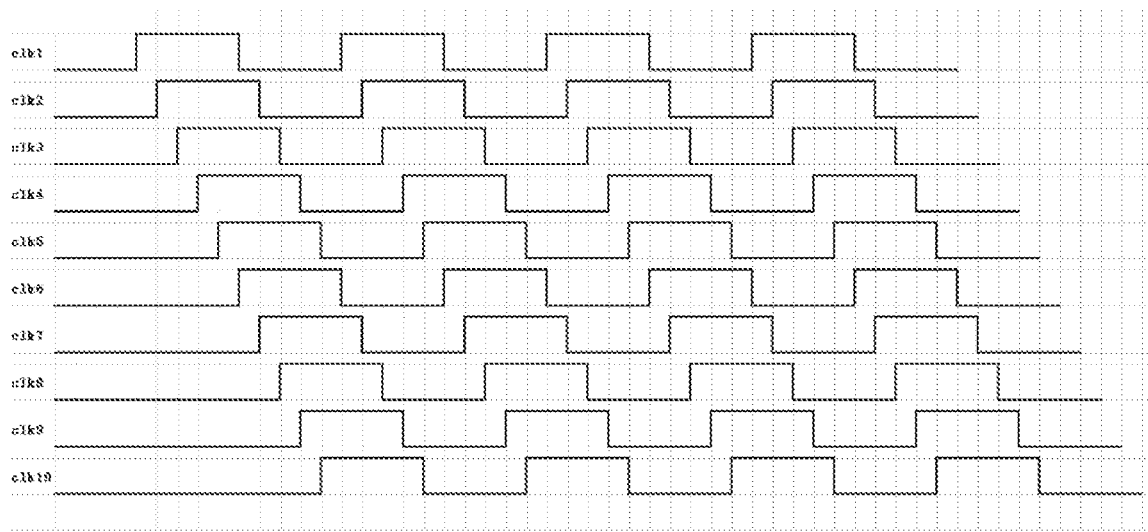
FIG. 15 is a timing diagram of a gate driving circuit in a case where the number of the clock signal lines is 10 and the duty ratio of the clock signal is 50%.
Figure 16:
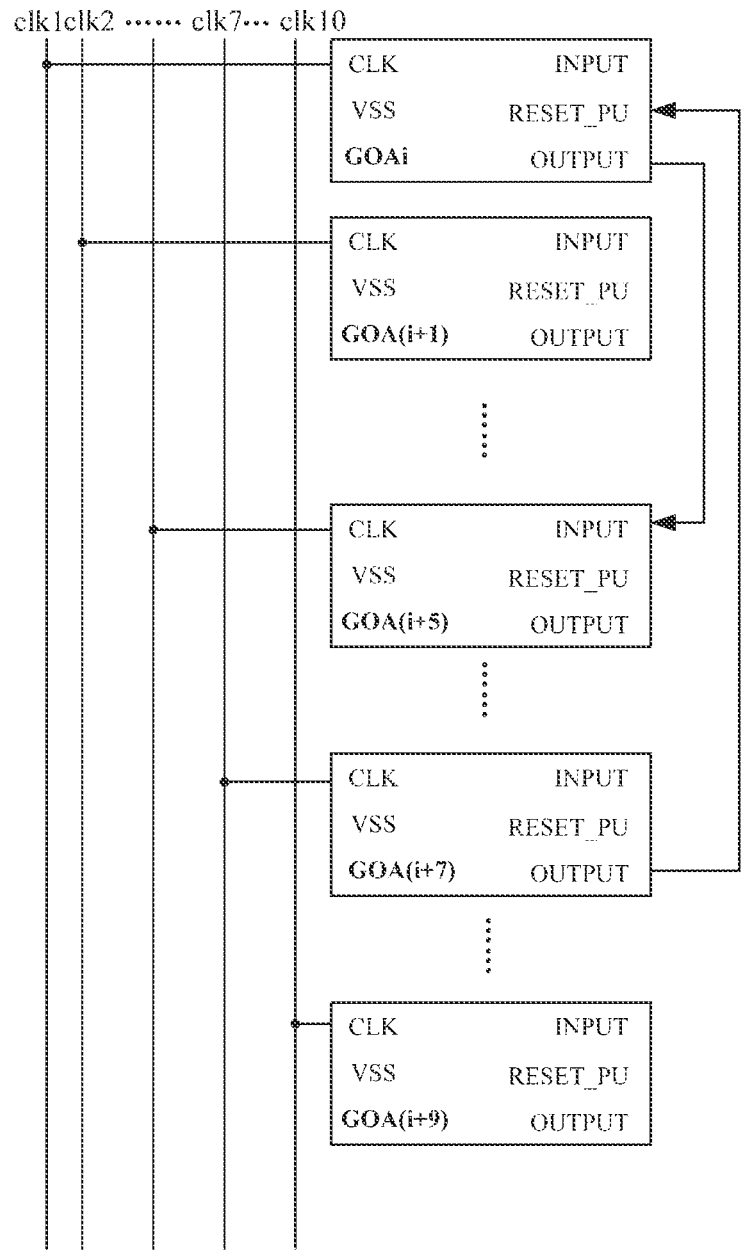
FIG. 16 is a schematic diagram of a cascade of a gate driving circuit when a pull-up node is reset with a delay of 2H in the case where the number of the clock signal lines is 10 and the duty ratio of the clock signal is 50%.

A description is given below by taking a case where the number N of the clock signal lines is 10 and the duty ratio of the clock signal is 50% as an example. In such a case, p=5; 6<q<10, that is, a value of q may be 7, 8 or 9; as shown in FIG. 15 and FIG. 16, the shift registers in such a case under the condition that q=7 are first described; signal input terminals INPUT of a first to a fifth shift registers respond to a frame start signal; a signal output terminal OUTPUT of an $i^{th}$ shift register is connected to a signal input terminal INPUT of a $(i+5)^{th}$ shift register; and a pull-up reset signal terminal RESET_PU of a $j^{th}$ shift register is connected to a signal output terminal OUTPUT of a $(j+7)^{th}$ shift register; where i is taken from 1 to (M−5), and j is taken from 1 to (M−7). At this time, it can be seen that, in the gate driving circuit so cascaded, a pull-up node PU of each shift register is reset with a delay of 2H, so that an output sub-circuit of each shift register may operate for a delay of 2H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 14 redundant shift registers, a first to a tenth redundant shift registers among the 14 redundant shift registers are respectively connected to the 10 clock signal lines, and an eleventh to a fourteenth redundant shift registers are respectively connected to a first to a fourth clock signal lines; signal output terminals OUTPUT of a first to a seventh redundant shift registers are respectively connected to pull-up reset signal terminals RESET_PU of a $(M-6)^{th}$ to the $M^{th}$ shift registers; and signal output terminals OUTPUT of an eighth to a fourteenth redundant shift registers are respectively connected to pull-up reset signal terminals RESET_PU of the first to the seventh redundant shift registers. Signal output terminals OUTPUT of a $(M-4)^{th}$ to the $M^{th}$ shift registers are respectively connected to signal input terminals INPUT of the first to the fifth redundant shift registers; and the signal output terminal OUTPUT of the $h^{th}$ redundant shift register is connected to the signal input terminal INPUT of the $(h+5)^{th}$ redundant shift register; where h is taken from 1 to 9.

Figure 17:
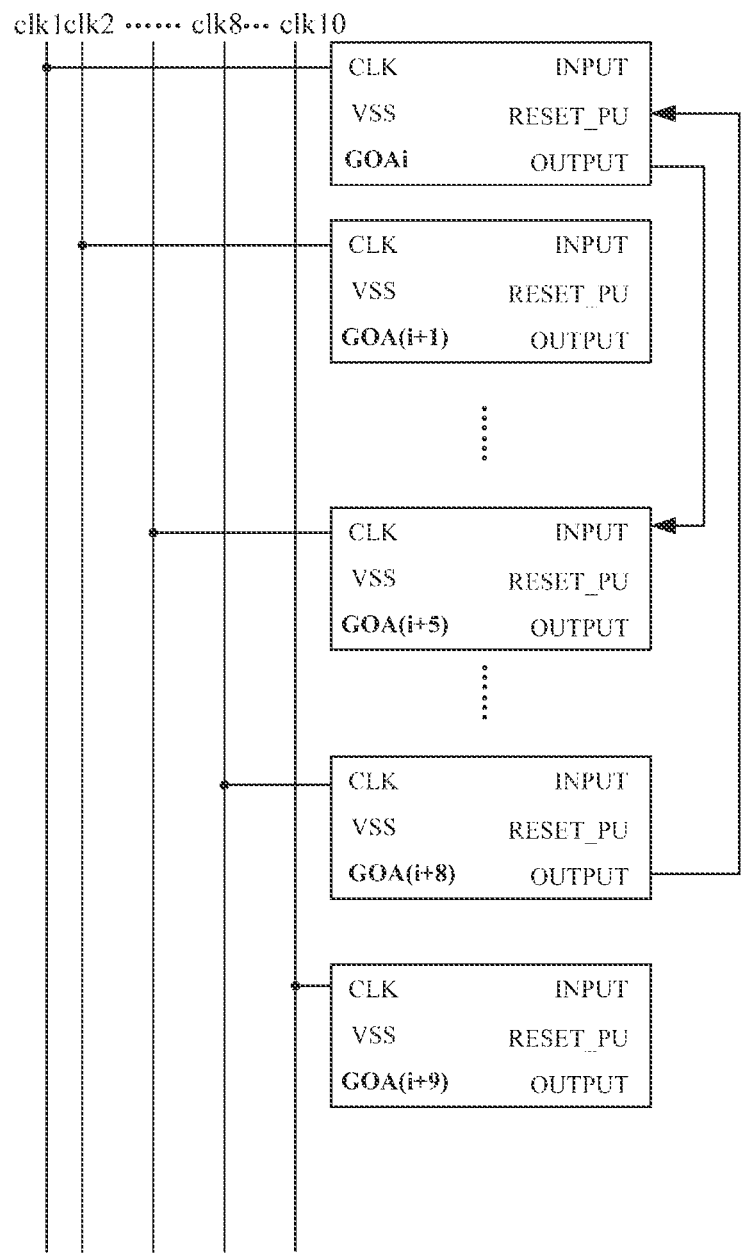
FIG. 17 is a schematic diagram of a cascade of a gate driving circuit when a pull-up node is reset with a delay of 3H in the case where the number of the clock signal lines is 10 and the duty ratio of the clock signal is 50%.

Similarly, as shown in FIG. 17, the shift registers in such a case under the condition that q=8 are then described: the signal input terminals INPUT of the first to the fifth shift registers respond to the frame start signal; the signal output terminal OUTPUT of the $i^{th}$ shift register is connected to the signal input terminal INPUT of the $(i+5)^{th}$ shift register; and the pull-up reset signal terminal RESET_PU of the $j^{th}$ shift register is connected to a signal output terminal OUTPUT of a $(j+8)^{th}$ shift register; where i is taken from 1 to (M−5), and j is taken from 1 to (M−8). At this time, it can be seen that, in the gate driving circuit so cascaded, a pull-up node PU of each shift register is reset with a delay of 3H, so that an output sub-circuit of each shift register may operate for a delay of 3H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 16 redundant shift registers, a first to a tenth redundant shift registers among the 16 redundant shift registers are respectively connected to the 10 clock signal lines, and an eleventh to a sixteenth redundant shift registers are respectively connected to a first to a sixth clock signal lines; signal output terminals OUTPUT of a first to an eighth redundant shift registers are respectively connected to pull-up reset signal terminals RESET_PU of a $(M-7)^{th}$ to the $M^{th}$ shift registers; and signal output terminals OUTPUT of a ninth to a sixteenth redundant shift registers are respectively connected to pull-up reset signal terminals RESET_PU of the first to the eighth redundant shift registers. The signal output terminals OUTPUT of the $(M-4)^{th}$ to the $M^{th}$ shift registers are respectively connected to signal input terminals INPUT of the first to the fifth redundant shift registers; and the signal output terminal OUTPUT of the $h^{th}$ redundant shift register is connected to the signal input terminal INPUT of the $(h+5)^{th}$ redundant shift register; where h is taken from 1 to 11.

Figure 18:
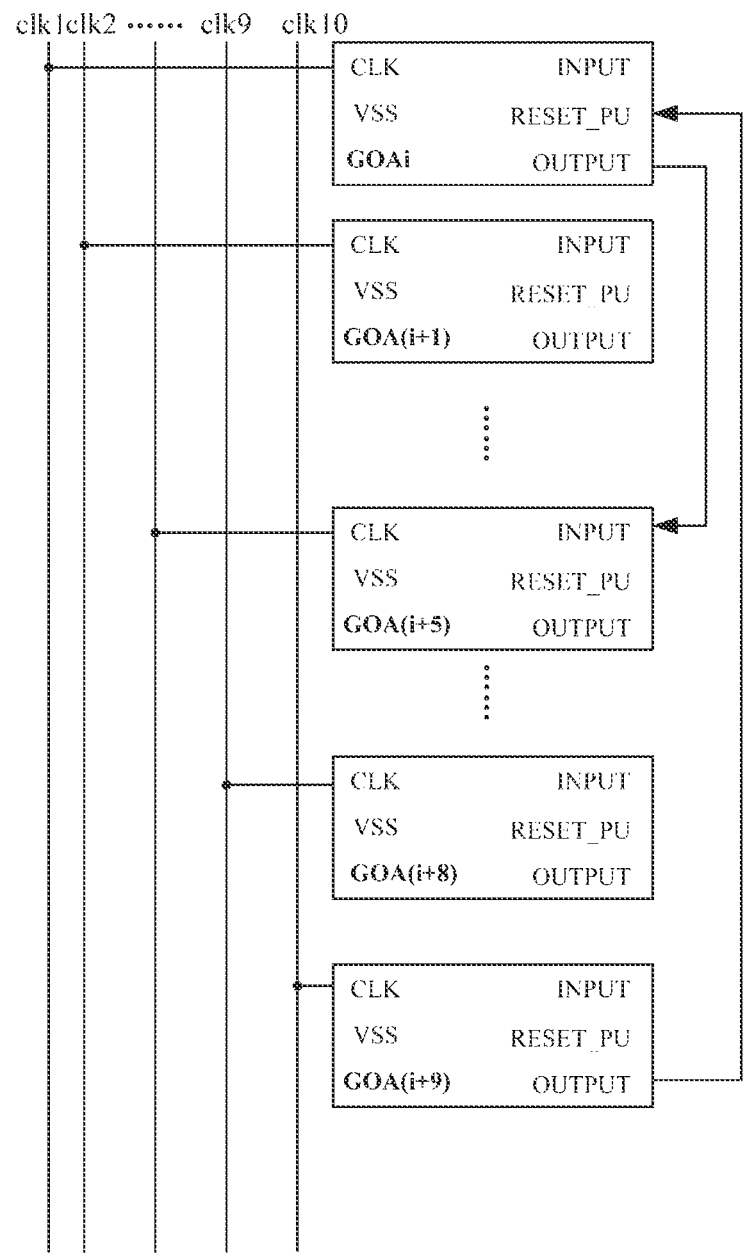
FIG. 18 is a schematic diagram of a cascade of a gate driving circuit when a pull-up node is reset with a delay of 4H in the case where the number of the clock signal lines is 10 and the duty ratio of the clock signal is 50%.

As shown in FIG. 18, the shift registers in such a case under the condition that q=9 are then described: the signal input terminals INPUT of the first to the fifth shift registers respond to the frame start signal; the signal output terminal OUTPUT of the $i^{th}$ shift register is connected to the signal input terminal INPUT of the $(i+5)^{th}$ shift register; and the pull-up reset signal terminal RESET_PU of the $j^{th}$ shift register is connected to a signal output terminal OUTPUT of a $(j+9)^{th}$ shift register; where i is taken from 1 to (M−9), and j is taken from 1 to (M−9). At this time, it can be seen that, in the gate driving circuit so cascaded, a pull-up node PU of each shift register is reset with a delay of 4H, so that an output sub-circuit of each shift register may operate for a delay of 4H, and the output sub-circuit may discharge a signal output terminal OUTPUT through a low level signal written through a clock signal line, thereby alleviating trailing of a falling edge of the signal output terminal OUTPUT.

In addition, the gate driving circuit with such a structure further includes 18 redundant shift registers, a first to a tenth redundant shift registers among the 18 redundant shift registers are respectively connected to the 10 clock signal lines, and an eleventh to an eighteenth redundant shift registers are respectively connected to a first to an eighth clock signal lines; signal output terminals OUTPUT of a first to a ninth redundant shift registers are respectively connected to pull-up reset signal terminals RESET_PU of a $(M-8)^{th}$ to the $M^{th}$ shift registers; and signal output terminals OUTPUT of a tenth to an eighteenth redundant shift registers are respectively connected to pull-up reset signal terminals RESET_PU of the first to the ninth redundant shift registers. The signal output terminals OUTPUT of the $(M-4)^{th}$ to the $M^{th}$ shift registers are respectively connected to signal input terminals INPUT of the first to the fifth redundant shift registers; and the signal output terminal OUTPUT of the $h^{th}$ redundant shift register is connected to the signal input terminal INPUT of the $(h+5)^{th}$ redundant shift register; where h is taken from 1 to 13.

In a second aspect, an embodiment of the present disclosure provides a display panel, which includes any one of the gate driving circuits described above. Due to the display panel including any one of the gate driving circuits, tailing of a signal output by a signal output terminal OUTPUT of the display panel is alleviated.

The display panel may be any product or component with a display function, such as a mobile phone, a tablet computer, a television, a display, a notebook computer, a digital photo frame or a navigator.

Of course, the display panel provided by the present embodiment may further include other conventional structures, such as a power supply unit and a display driving unit. It should be understood that the above embodiments are merely exemplary embodiments adopted to illustrate the principle of the present disclosure, and the present disclosure is not limited thereto. Various modifications and improvements can be made by those of ordinary skill in the art without departing from the spirit and essence of the present disclosure, and these modifications and improvements are considered to fall within the scope of the present disclosure.

What is claimed is:

1. A gate driving circuit, comprising M shift registers and N clock signal lines; every N adjacent shift registers among the M shift registers being respectively connected to the N clock signal lines, where N is an even number greater than, and M is an integer greater than or equal to N;
   wherein each of the M shift registers at least comprises an input sub-circuit, an output sub-circuit and a pull-up reset sub-circuit; in response to an input signal input by a signal input terminal, the input sub-circuit writes the input signal into a pull-up node; in response to a potential of the pull-up node, the output sub-circuit outputs a clock signal input by a clock signal terminal through a signal output terminal; and in response to a pull-up reset signal input by a pull-up reset signal terminal, the pull-up reset sub-circuit resets the potential of the pull-up node through a turn-off level signal;
   a signal output terminal of an $i^{th}$ shift register is connected to a signal input terminal of a $(i+p)^{th}$ shift register, where $(N-4)/2 \leq p \leq N/2$, and i is taken from 1 to (M−p);
   a pull-up reset signal terminal of a $j^{th}$ shift register is connected to a signal output terminal of a $(j+q)^{th}$ shift register, where $1 < q-p < N/2$, and j is taken from 1 to (M−q);
   wherein each of the shift registers further comprises an output reset sub-circuit and in response to an output reset signal input by an output reset signal terminal, the output reset sub-circuit resets the signal output terminal through the turn-off level signal;
   wherein an output reset signal terminal of a $k^{th}$ shift register is connected to a signal output terminal of a $(k+p)^{th}$ shift register, where k is taken from 1 to (M−p);
   wherein the output reset signal terminal is configured to reset only the signal output terminal; and
   wherein the output sub-circuit is configured to operate for a delay of ⅔ of one period of the clock signal.

2. The gate driving circuit of claim 1, wherein p=(N−4)/2 in a case where a duty ratio of the clock signal is 30% and N≥6.

3. The gate driving circuit of claim 2, wherein signal input terminals of a first to a $((N-4)/2)^{th}$ shift registers respond to a frame start signal;
   the gate driving circuit further comprises 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers;

signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-6)/2)^{th}$ to the $M^{th}$ shift registers are respectively connected to signal input terminals of the first to a $((N-4)/2)^{th}$ redundant shift registers; and a signal output terminal of an $h^{th}$ redundant shift register is connected to a signal input terminal of a $(h+(N-4)/2)^{th}$ redundant shift register; where h is taken from 1 to $(2q-(N-4)/2)$.

4. The gate driving circuit of claim 1, wherein $p=(N-2)/2$ in a case where a duty ratio of the clock signal is 40% and N>4.

5. The gate driving circuit of claim 4, wherein signal input terminals of a first to a $((N-2)/2)^{th}$ shift registers respond to a frame start signal;

the gate driving circuit further comprises 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers;

signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-4)/2)^{th}$ to the $M^{th}$ shift registers are respectively connected to signal input terminals of the first to a $((N-2)/2)^{th}$ redundant shift registers; and a signal output terminal of an $h^{th}$ redundant shift register is connected to a signal input terminal of a $(h+(N-2)/2)^{th}$ redundant shift register; where h is taken from 1 to $(2q-(N-2)/2)$.

6. The gate driving circuit of claim 1, wherein $p=N/2$ in a case where a duty ratio of the clock signal is 50% and N>4.

7. The gate driving circuit of claim 6, wherein signal input terminals of a first to a $N/2^{th}$ shift registers respond to a frame start signal;

the gate driving circuit further comprises 2q redundant shift registers, and every N adjacent redundant shift registers among the 2q redundant shift registers are respectively connected to the N clock signal lines;

signal output terminals of a first to a $q^{th}$ redundant shift registers are respectively connected to pull-up reset signal terminals of a $(M-q+1)^{th}$ to an $M^{th}$ shift registers;

signal output terminals of a $(q+1)^{th}$ to a $(2q)^{th}$ redundant shift registers are respectively connected to pull-up reset signal terminals of the first to the $q^{th}$ redundant shift registers; and signal output terminals of a $(M-(N-2)/2)^{th}$ to the $M^{th}$ shift registers are respectively connected to signal input terminals of the first to a $N/2^{th}$ redundant shift registers; and a signal output terminal of an $h^{th}$ redundant shift register is connected to a signal input terminal of a $(h+N/2)^{th}$ redundant shift register; where h is taken from 1 to $(2q-N/2)$.

8. A display panel, comprising the gate driving circuit of claim 1.

* * * * *

UNITED STATES PATENT AND TRADEMARK OFFICE
CERTIFICATE OF CORRECTION

PATENT NO. : 11,893,919 B2
APPLICATION NO. : 17/765373
DATED : February 6, 2024
INVENTOR(S) : Qiujie Su et al.

It is certified that error appears in the above-identified patent and that said Letters Patent is hereby corrected as shown below:

On the Title Page

Item (72), please remove the Inventors in the current order and replace with the Inventors in the correct order as follows: "Qiujie SU, Hongli YUE, Feng QU, Zhihua SUN, Seungmin LEE, Yanping LIAO".

Signed and Sealed this
Nineteenth Day of March, 2024

Katherine Kelly Vidal
*Director of the United States Patent and Trademark Office*